United States Patent
Bassani et al.

(10) Patent No.: US 9,718,692 B2
(45) Date of Patent: Aug. 1, 2017

(54) METHOD FOR EXFOLIATING CARBONACEOUS MATERIALS CONTAINING GRAPHITE, ASSISTED BY A DIELS-ALDER REACTION

(71) Applicants: UNIVERSITÉ DE BORDEAUX, Bordeaux (FR); INSTITUT POLYTECHNIQUE DE BORDEAUX, Talence (FR); CENTRE NATIONAL DE LA RECHERCHE SCIENTIFIQUE—CNRS, Paris (FR)

(72) Inventors: Dario Bassani, Pessac (FR); Jean-Baptiste Verlhac, Talence (FR); Hugo Florian Bares, Talence (FR)

(73) Assignees: UNIVERSITÉ DE BORDEAUX, Bordeaux (FR); INSTITUT POLYTECHNIQUE DE BORDEAUX, Talence (FR); CENTRE NATIONAL DE LA RECHERCHE SCIENTIFIQUE, Paris (FR)

(*) Notice: Subject to any disclaimer, the term of this patent is extended or adjusted under 35 U.S.C. 154(b) by 0 days.

(21) Appl. No.: 14/909,012

(22) PCT Filed: Jul. 30, 2014

(86) PCT No.: PCT/FR2014/051976
§ 371 (c)(1),
(2) Date: Jan. 29, 2016

(87) PCT Pub. No.: WO2015/015120
PCT Pub. Date: Feb. 5, 2015

(65) Prior Publication Data
US 2016/0194207 A1 Jul. 7, 2016

(30) Foreign Application Priority Data
Jul. 31, 2013 (FR) .................................... 13 57602

(51) Int. Cl.
C01B 31/04 (2006.01)
H01L 51/52 (2006.01)

(52) U.S. Cl.
CPC ...... *C01B 31/0469* (2013.01); *C01B 31/0423* (2013.01); *H01L 51/5203* (2013.01);
(Continued)

(58) Field of Classification Search
CPC .. B23K 26/1405; B23K 26/402; B23K 26/40; B23K 26/142; B23K 26/4005;
(Continued)

(56) References Cited

FOREIGN PATENT DOCUMENTS

| EP | 2327662 A1 | 6/2011 |
|---|---|---|
| KR | 20120104767 A | 9/2012 |
| WO | 2012051597 A2 | 4/2012 |

OTHER PUBLICATIONS

English machine translation of KR10201204767.*
(Continued)

*Primary Examiner* — Richard M Rump
(74) *Attorney, Agent, or Firm* — Cantor Colburn LLP

(57) ABSTRACT

The present invention relates to a process for exfoliating graphite in carbonaceous materials facilitated by a Diels-Alder reaction, and the applications of same, in particular for producing electronic or microelectronic components such as transparent conductive electrodes. The inventive method comprises a Diels-Alder reaction between a material containing graphite and an anthrone compound represented by formula (I), wherein X, $R_1$, $R_2$, $R_3$ and $R_4$ are as defined in the description, in an organic solvent, in the presence of a base, and subjected to sonication, ball-milling and/or high-shear mixing, at a temperature of between 15° C. and 65° C., to obtain the corresponding graphene Diels-Alder adduct.

14 Claims, 9 Drawing Sheets

(52) U.S. Cl.
CPC ...... *C01B 2204/02* (2013.01); *C01B 2204/04* (2013.01); *H01L 2251/301* (2013.01)

(58) Field of Classification Search
CPC .............. B23K 26/4045; B23K 26/408; B23K 26/4085; B23K 26/4065; B23K 26/14; B23K 26/38; B23K 2203/36; B23K 2203/50; B23K 2203/42; B23K 2203/16; B23K 2203/52; C01B 31/20
See application file for complete search history.

(56) References Cited

OTHER PUBLICATIONS

Kim, Seyoung, et al. "Realization of a high mobility dual-gated graphene field-effect transistor with Al 2 O 3 dielectric." Applied Physics Letters 94.6 (2009): 062107.*

Goki Eda et al., "Large-area ultrathin films of reduced graphene oxide as a transparent and flexible electronic material", Nature Natotechnology, 2008, vol. 3, pp. 270-274.

Michio Goichi et al. "Improved Synthesis of 1,8-Diiodoanthracene and Its Application to the Synthesis of Multiple Phenylethynyl-Substituted Anthracenes", Synthesis, 2005, vol. 13, pp. 2116-2118.

Byung-Jae Kim et al. "Transparent, conductive graphene electrode in GaN-based ultra-violet light emitting diodes", Optics Express, 2010, vol. 18, No. 22, pp. 23030-23034.

Hyesung Park et al., "Graphene as transparent conducting electrodes in organic phtovoltaics: Studies in graphene morphology, hole transporting layers, and counter electrodes", Nano Letters, 2012, vol. 12, pp. 133-140.

Shi Li et al. "Synthesis of 1,2,3,4,8,9,10,11-Octasubstituted Pentacenequinone Derivatives and their Conversion into Substituted Pentacenes", Chemistry—An Asian Journal, 2010, vol. 5, pp. 1620-1626.

Michael J. McAllister et al. "Single Sheet Functionalized Graphene by Oxidation and Thermal Expansion of Graphite", Chem. Mater, 2007, vol. 19, No. 18, pp. 4396-4404.

Xuan Wang et al. "Transparent, conductive graphene electrodes for dye-sensitize solar cells", Nano Letters, 2008, vol. 8, No. 1, pp. 323-327.

Sandip Niyogi et al. "Solution Properties of Graphite and Graphene", J. Am. Chem. Soc., 2006, vol. 128, pp. 7720-7721.

Keith R. Paton et al. "Scalable Production of Large Quantities of Defect-free few-layer Graphene by Shear exfoliation in Liquids", Nature Materials, 2014, vol. 13, pp. 624-630.

Qing Hua Wang et al., "Understanding and controlling the substrate effect on graphene electron-transfer chemistry via reactivity imprint lithography", Nature Chemistry, 2012, vol. 4, pp. 724-732.

Rozhkov et al., "Electonic properties of mesoscopic graphene structures: Charge confinement and control of spin and charge transport", Physics Reports, 2011, vol. 503, pp. 77-114.

S. Abdulalmohsin et al. "Graphene-Enriched P3HT and Porphyrin-Modified ZnO Nanowire Arrays for Hybrid Solar Cell Application", J. Phys. Chem. C., 2012, vol. 116, pp. 9433-9438.

Soma Chakraborty et al. "Functionalization of potassium graphite", Angew. Chem. Int. Ed., 2007, vol. 46, pp. 4486-4488.

Theodosis Skaltsas et al., "Graphene exfoliation in organic solvents and switching solubility in aqueous media with the aid of amphiphilie block copolymers", J. Mater. Chem., 2012, vol. 22, pp. 21507-21512.

Zhao et al., "Preparation of graphene by exfoliation of graphite using wet ball-milling", J. Mater, Chem. 2010, vol. 20, pp. 5817.

Bernard Garrigues et al. "Microwave-assisted carbonyl Diels-Alder and carbonyl-ene reactions supported on graphite", Liebigs Annalen: Organic and Bioorganic Chemistry, VCH Publishers, Jan. 1, 1996, No. 5; pp. 743-744.

International Search Report issued Mar. 17, 2015 re: Application No. PCT/FR2014/051976; pp. 1-4; citing: EP 2 327 662 A1, Wang et al., WO 2012/051597 A2, Santanu et al., "Diels-Alder . . . ", Santanu et al. "Chemistry . . . ", Garrigues et al. and Zydziak et a.

Nicolas Zydziak et al. "Diels-Alder reactions for carbon material synthesis and surface functionalization", Polymer Chemistry, Mar. 12, 2013; vol. 4, No. 15, p. 4072; XP055123011.

Olivier Riant et al. "Asymmetric Diels-Alder Reaction Catalyzed by Chiral Bases", Tetrahedron Letters, Jan. 1, 1989, vol. 30, No. 52, p. 7403, XP055169675.

Sarkar Santanu et al. "Chemistry at the Dirac Point: Diels-Alder Reactivity of Graphene", Accounts of Chemical Research, Apr. 17, 2012, vol. 45, No. 4, pp. 673-682.

Sarkar Santanu et al. "Diels-Alder Chemistry of Graphite and Graphene: Graphene as Diene and Dienophile", Journal of the American Chemical Society, Mar. 16, 2011, vol. 133, No. 10, pp. 3324-3327.

Xuan Wang et al. "Transparent, conductive graphene electrodes for dye-sensitized solar cells", Nano Letters, American Chemical Society, Nov. 12, 2007, vol. 8, No. 1, pp. 323-327.

* cited by examiner

| | a | b | c | d | e |
|---|---|---|---|---|---|
| Weight (mg) | 1.15 | 0.75 | 1.2 | 1.2 | 0.8 |
| Concentration (mg.ml$^{-1}$) | 0.023 | 0.015 | 0.024 | 0.024 | 0.016 |

METHOD FOR EXFOLIATING CARBONACEOUS MATERIALS CONTAINING GRAPHITE, ASSISTED BY A DIELS-ALDER REACTION

PRIORITY

The present patent application claims the priority of patent application FR 1 357 602, filed on 31 Jul. 2013, the entire contents of which are hereby incorporated herein by reference.

TECHNICAL FIELD

The present invention relates to a process for the exfoliation of graphite in carbon-based materials facilitated by the Diels-Alder reaction, and to its applications, in particular to the manufacture of electronic or microelectronic components, such as transparent conducting electrodes.

The present invention also relates to the Diels-Alder adducts obtainable by such a process, to graphene sheets obtainable from these adducts, and to uses of these graphene sheets.

In the description below, the references between square brackets ([ ]) refer to the list of references presented after the examples.

BACKGROUND

Graphene is a two-dimensional (monoplane) carbon crystal, the stack of which forms graphite. It possesses excellent electronic properties and is potentially available in a large amount by exfoliation of graphite.

Processes for the manufacture of graphene exist but they are far from being optimal and viable from an industrial viewpoint.

Existing processes for the mechanical or ultrasound-assisted exfoliation of graphite make it possible to obtain graphene in dispersion in an organic solvent. However, the resulting material exhibits a density of defects which is proportional to the applied mechanical stress, rendering the resulting graphene unsuitable for the targeted industrial applications.

Graphene can also be produced by chemical vapor deposition (CVD) on metal substrates capable of catalyzing its formation (e.g., Ni or Cu) and transferred onto other substrates by a delamination process. The advantages are the possibility of obtaining very thin graphene layers (one or two layers) of high quality but the process is lengthy and expensive.

A few attempts at dissolution have been reported, mainly by functionalization of graphite (Chakraborty et al., "Functionalization of potassium graphite", Angew. Chem. Int. Ed., 46, 4486-4488 (2007) [ref. 1]) or graphite oxide (Niyogi et al., "Solution Properties of Graphite and Graphene", J. Am. Chem. Soc., 128, 7720-7721 (2006) [ref. 2]; McAllister et al., "Single Sheet Functionalized Graphene by Oxidation and Thermal Expansion of Graphite", Chem. Mater., 2007, 19 (18), 4396-4404 [ref. 3]).

The chemical modification of graphene by oxidation to give graphene oxide makes it possible to obtain a material which is more easily dissolved in polar and aqueous solvents. However, the reduction of graphene oxide to give graphene is difficult and often incomplete and does not make it possible to obtain defect-free graphene sheets.

Generally, current exfoliation processes require the use of heavy solvents (N-methylpyrrolidine, boiling point 202° C.), highly halogenated solvents (1,2-dichlorobenzene) or solvents which are not very compatible with applications in the electronics industry (ionic liquid). Furthermore, they often require high doses of ultrasound, resulting in a high degree of degradation of the graphene obtained, which is harmful to its use in the targeted industrial applications. Furthermore, these methods exhibit the disadvantage that the graphite planes obtained are functionalized and/or denatured.

To date, the industrial development of graphene is limited, mainly due to the difficulties in manufacturing and employing the material, such as those mentioned above. There exists a real need for a process which overcomes the abovementioned failings, disadvantages and obstacles of the prior art, in particular for a process which makes it possible to obtain high-quality graphene sheets with few defects in solvents supposed until now to be not very favorable to the dissolution of graphene.

Description

The present invention specifically aims at meeting this need by providing a process for the exfoliation of a graphite-containing material, comprising a Diels-Alder reaction between the graphite-containing material and an anthrone-type compound having the following formula (I):

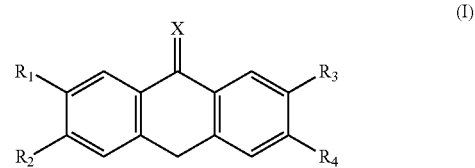

(I)

wherein:

X represents O or S;

$R_1$, $R_2$, $R_3$ and $R_4$ independently represent a hydrogen atom, $-NR^AR^B$, $-N^+R^AR^BR^C$, $-OR$, $-CO_2M$ or $-SO_3M$; or else $R_1$ and $R_2$, on the one hand, and $R_3$ and $R_4$, on the other hand, together form an optionally substituted unsaturated $C_6$ cycloalkyl group to result in a pentacenone-type compound of formula (II) having the following structure:

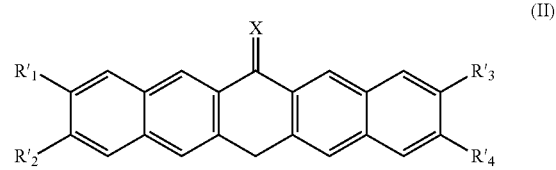

(II)

wherein:

X represents O or S;

$R'_1$, $R'_2$, $R'_3$ and $R'_4$ independently represent a hydrogen atom, $-NR^AR^B$, $-N^+R^AR^BR^C$, $-OR$, $-CO_2M$ or $-SO_3M$;

where M represents a hydrogen atom or an alkali metal atom; and each occurrence of R, $R^A$, $R^B$ and $R^C$ independently represents a hydrogen atom or a linear or branched $C_1$ to $C_{16}$ alkyl;

in an organic solvent, in the presence of a base, and under sonication, ball-milling and/or high-shear mixing, at a temperature of between 15° C. and 65° C., to obtain the corresponding Graphene Diels-Alder adduct.

Advantageously, the graphite-containing material can be any material known in the art which comprises graphite. For example, it may be graphite or carbon black.

Advantageously, the process can be carried out with anthrone-type or pentacenone-type compounds of formula $I^A$ or $II^A$ below:

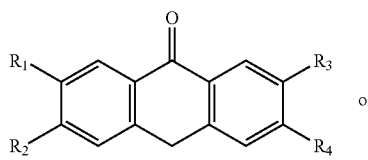
(I^A)

or

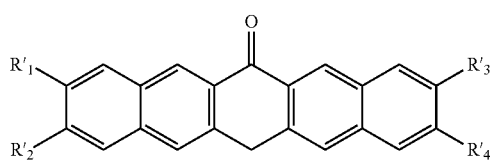
(II^A)

wherein $R_1$, $R_2$, $R_3$, $R_4$, $R'_1$, $R'_2$, $R'_3$ and $R'_4$ are as defined above. In certain embodiments, the process can be carried out with compounds of formula $I^A$ or $II^A$ as defined above under sonication and at a temperature of between 15° C. and 65° C.

Advantageously, the process can be carried out with thioanthrone-type or thiopentacenone-type compounds of formula $I^B$ or $II^B$ below:

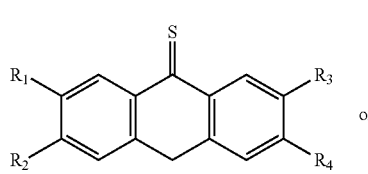
(I^B)

or

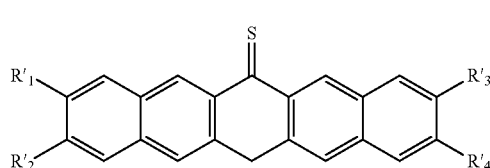
(II^B)

wherein $R_1$, $R_2$, $R_3$, $R_4$, $R'_1$, $R'_2$, $R'_3$ and $R'_4$ are as defined above.

In each of the formulae I, II, $I^A$, $II^A$, $I^B$ and $II^B$, in the definitions of $R_1$, $R_2$, $R_3$, $R_4$, $R'_1$, $R'_2$, $R'_3$ and $R'_4$, the R radical can also represent, independently for each occurrence of R, a polyethylene glycol radical of formula:

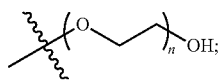

wherein n represents an integer from 1 to 6, preferably from 1 to 3, preferably 3.

In the context of the present invention, the term "graphene" is understood to mean an essentially two-dimensional crystal of carbon atoms composed of one to five (monoplane) sheet(s) of carbon atoms. Thus, in the present document, the term "graphene" covers the strict (scientific) definition of graphene (namely a two-dimensional (monoplane) crystal of carbon atoms, the stack of which constitutes graphite), but also encompasses multilayered graphene (2 to 5 sheets). Thus, the term "graphene" used in the context of the present invention refers to a material existing in the form of a monolayer sheet of carbon atoms, of multilayer sheets of carbon atoms (2 to 5 sheets) or of a mixture of these.

Advantageously, the abovementioned Graphene Diels-Alder adduct exists in the form of monolayer sheets, of multilayer sheets of a few sheets (2 to 5 sheets) or of a mixture of these.

Entirely surprisingly, the process of the invention, by virtue of the use of the abovementioned anthrone-type or pentacenone-type compounds or the thio analogs, thus makes it possible to exfoliate graphene sheets from graphite, in the form of a Graphene Diels-Alder adduct (monolayer sheets or multilayer sheets of 2 to 5 sheets), in a first step, and then to give graphene subsequent to an annealing step. Specifically, until now, attempts at a Diels-Alder reaction on graphite samples resulted only in the functionalization of said graphite, without exfoliation (cf. Haddon et al., Accounts of Chemical Research, vol. 45(4), 2012, 673-682 [ref. 14], Haddon et al., JACS, 133, 2011, 3324-3327 [ref. 15], and Korean patent application KR2012-0104767 [ref. 16]).

The present invention constitutes the first implementation of an exfoliation of graphite to give graphene sheets (monolayer sheets or multilayer sheets of 2 to 5 sheets) via a Diels-Alder reaction.

Without wishing to be bound by any particular theory, the anthrone-type or thioanthrone-type compounds according to the present invention (compounds of formula I or II), unlike other dienes reported in the literature in Diels-Alder reactions carried out on graphite but not resulting in its exfoliation (cf. abovementioned publications Haddon et al., 2011, and Korean patent application KR2012-0104767), make possible precisely the exfoliation of graphene sheets due to the reactivity of these specific dienes: this reactivity is due to their tautomerism, which generates in situ the anthracenol/thioanthracenol or pentacenol/thiopentacenol form, respectively.

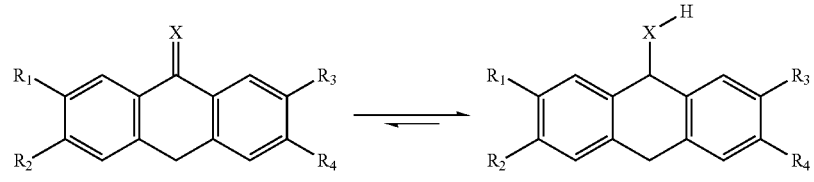

X = O or S

This tautomeric equilibrium is accelerated by the presence of base, which also makes it possible to deprotonate the anthracenol or the pentacenol and to thus form the anthracenolate or pentacenolate anion, respectively. By way of comparison, under these conditions, anthracenol is a diene 1000 to 10 000 times more reactive with regard to Diels-Alder reactions, in comparison with anthracene and with 9-methylanthracene (and also with other common dienes), due to the high electron density. Another advantage is that the anthrone/thioanthrone (and pentacenone/thiopentacenone) forms are themselves depleted in electrons, which renders then very stable to oxidation and to photo oxidation. This is very noticeable in comparison with pentacene, which spontaneously oxidizes in the air and is photosensitive. In comparison with the alkene compounds, this reverses a Diels-Alder reaction as the graphene would behave as a diene.

Furthermore, the compounds of (thio)anthrone type of formula I or II make it possible, via their (thio)anthracenol or (thio)pentacenol tautomeric form, to obtain Diels-Alder adducts of graphene under milder conditions due to their high reactivity in the presence of a base. The adducts exhibit a high steric hindrance (triptacene structure of "butterfly" form) which is favorable to the dissolution of the graphene sheets (in Diels-Alder adduct form). The retro-cyclization reaction, to give the initial graphene and the anthracenol/thioanthacenol or pentacenol/thiopentacenol, takes place at relatively low temperatures, which makes it possible to envisage applications by deposition on plastic substrates.

The exfoliation of graphite to give monoatomic sheets (graphene) requires a great deal of energy in order to counterbalance the adhesive forces which bond the sheets together. The present invention makes use of a reversible reaction between polyaromatic compounds and the graphene sheets making up the graphite in order to induce distortions in the monoatomic planes, resulting in their exfoliation under mild conditions. The reaction used is a Diels-Alder cycloaddition (FIG. 1) involving an anthracene or [n]-acene (n=3-5) derivative (also denoted "acene" in what follows) of formula I or II as defined above having charged or neutral substituents capable of increasing the reactivity of the acene with regard to the cycloaddition reaction. The process makes it possible to obtain exfoliated graphene in various solvents. Depending on the reactivity of the acene and of the solvent used, it may be necessary to assist the exfoliation process with a slight thermal activation, in addition to the ultrasound. In the case of charged substituents, such as quaternary ammonium (for example —$N^+R^AR^BR^C$) groups, carboxylate (for example —$CO_2^-Na^+$) groups or sulfonate (for example —$SO_3^-Na^+$) groups, the graphene sheets thus obtained (1 to 5 sheets) can also be charged and can be neutralized with a protonating or deprotonating agent or by a chemical reaction, thus making possible the post-functionalization of the exfoliated graphene.

The exfoliated graphene suspensions obtained can be very stable and can be directly used for various applications requiring exfoliated graphene. For example, transparent conducting electrodes can be manufactured by depositing a thin layer of exfoliated Graphene Diels-Alder adduct on a transparent support. A step of annealing under vacuum, the temperature and the duration of which depend on the chemical nature of the acene used, makes it possible to remove the acene by sublimation.

Without wishing to be bound by any particular theory, it is proposed that the reaction mechanism involves the formation in situ of a highly reactive acene in equilibrium with the enone form (anthrone for 9-anthracenol and 6,6-dihydropentacen-13-one for 6-pentacenol (FIG. 1A); thioanthrone for 9-thioanthracenol and 6,6-dihydrothiopentacen-13-one for 6-thiopentacenol (FIG. 1B)). The latter rapidly reacts with the dienophile sites of the graphene to form a Diels-Alder adduct, the three-dimensional structure and the $sp^3$ carbon centers of which deform the flatness of the graphene sheet (FIGS. 1A and 1B). This results in its exfoliation and contributes to its stabilization in solution. Any organic base soluble in the reaction medium makes it possible to accelerate the exchange between the ketone and enol forms of the acene.

The synthesis of anthrones and pentacenones has been known for a very long time. The reader will know how to adapt the known synthetic methods in order to prepare the compounds of formula I and II used in the context of the present invention, including the derivatives carrying alkoxyl, polyethylene glycol, amino, quaternary ammonium, carboxyl, carboxylate or sulfonate substituents in the $R_1$ to $R_4$ and $R'_1$ to $R'_4$ positions. Mention may be made, for example, of Goichi et al., "Improved Synthesis of 1,8-Diiodoanthracene and Its Application to the Synthesis of Multiple Phenylethynyl-Substituted Anthracenes", *Synthesis*, 2005(13), 2116-2118 [ref. 12] and Li et al., Synthesis of 1,2,3,4,8,9,10,11-Octasubstituted Pentacenequinone Derivatives and their Conversion into Substituted Pentacenes, *Chemistry—An Asian Journal*, 2010, 5, 1620-1626 [ref. 13].

Advantageously, in the compound of formula (I), $R_1$, $R_2$, $R_3$ and $R_4$ independently represent a hydrogen atom, —$NR^AR^B$, —$N^+R^AR^BR^C$, —OR, —$CO_2M$ or —$SO_3M$, where each occurrence of R, $R^A$, $R^B$ and $R^C$ independently represents a hydrogen atom or a linear or branched $C_1$ to $C_{12}$ alkyl group, for example a linear or branched $C_1$ to $C_8$ alkyl group, advantageously a branched $C_8$ alkyl group, and R, for each occurrence, can also represent a polyethylene glycol radical of formula:

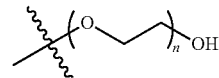

wherein n represents an integer from 1 to 6, preferably from 1 to 3, preferably 3. Advantageously, in the compound of formula (I), $R_1$, $R_2$, $R_3$ and $R_4$ independently represent a hydrogen atom, —$N^+R^AR^BR^C$, —OR, —$CO_2M$ or —$SO_3M$, where M represents a hydrogen atom or an alkali metal atom, such as Li, Na or K (preferably, M represents Na), and each occurrence of R, $R^A$, $R^B$ and $R^C$ independently represents a hydrogen atom or a methyl, ethyl, n-propyl, isopropyl, n-butyl, t-butyl, sec-butyl, n-pentyl or n-hexyl group, and R, for each occurrence, can also represent a polyethylene glycol radical of formula:

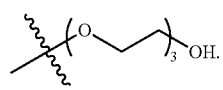

Advantageously, in the compound of formula (I), $R_1$, $R_2$, $R_3$ and $R_4$ independently represent —$N^+R^AR^BR^C$, —$CO_2M$ or —$SO_3M$, where M represents an alkali metal atom, such as Li, Na or K (preferably, M represents Na), and each occurrence of $R^A$, $R^B$ and $R^C$ independently represents a hydrogen atom or a methyl, ethyl, n-propyl, isopropyl, n-butyl, t-butyl, sec-butyl, n-pentyl or n-hexyl group, and R, for each occurrence, can also represent a polyethylene glycol radical of formula:

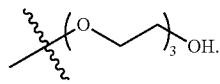

Advantageously, in the compound of formula (I), $R_1$, $R_2$, $R_3$ and $R_4$ independently represent a hydrogen atom, —$NR^A R^B$ or —OR, where each occurrence of R, $R^A$ and $R^B$ independently represents a hydrogen atom or a methyl, ethyl, n-propyl, isopropyl, n-butyl, t-butyl, sec-butyl, n-pentyl or n-hexyl group, and R, for each occurrence, can also represent a polyethylene glycol radical of formula:

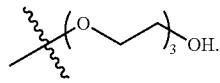

In a variant, $R_1$, $R_2$, $R_3$ and $R_4$ independently represent a hydrogen atom or —$NR^A R^B$, and $R^A$ and $R^B$ independently represent a hydrogen atom or a methyl or ethyl group. In an alternative form, $R_1$, $R_2$, $R_3$ and $R_4$ independently represent a hydrogen atom or —$NR^A R^B$, and $R^A$ and $R^B$ each represent a hydrogen atom or a methyl or ethyl group. In a variant, $R_1$, $R_2$, $R_3$ and $R_4$ independently represent a hydrogen atom or —$NR^A R^B$, and $R^A$ and $R^B$ each represent a hydrogen atom. In a variant, $R_1$, $R_2$, $R_3$ and $R_4$ each represent a hydrogen atom.

Advantageously, the compound of formula (I) has the following formula:

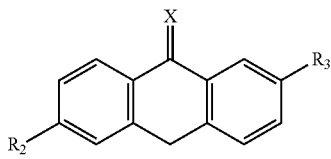

wherein X, $R_2$ and $R_3$ are as defined above, in all the alternative forms described above.

Advantageously, the compound of formula (I) has the following formula:

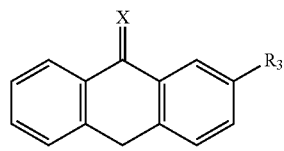

wherein X and $R_3$ are as defined above, in all the alternative forms described above.

Advantageously, in the compound of formula (I), $R_1$ and $R_2$, on the one hand, and $R_3$ and $R_4$, on the other hand, together form an optionally substituted unsaturated $C_6$ cycloalkyl group, in order to result in a compound of formula (II) having the following structure:

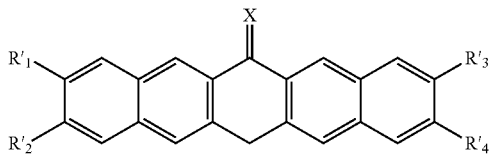

wherein X represents O or S, $R'_1$, $R'_2$, $R'_3$ and $R'_4$ independently represent a hydrogen atom, —$NR^A R^B$, —$N^+ R^A R^B R^C$, —OR, —$CO_2 M$ or —$SO_3 M$, where each occurrence of R, $R^A$, $R^B$ and $R^C$ independently represents a hydrogen atom or a linear or branched $C_1$ to $C_{12}$ alkyl group, for example a linear or branched $C_1$ to $C_8$ alkyl group, advantageously a branched $C_8$ alkyl group, and R, for each occurrence, can also represent a polyethylene glycol radical of formula:

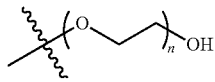

wherein n represents an integer from 1 to 6, preferably from 1 to 3, preferably 3. Advantageously, in the compound of formula (II), $R'_1$, $R'_2$, $R'_3$ and $R'_4$ independently represent a hydrogen atom, —$N^+ R^A R^B R^C$, —OR, —$CO_2 M$ or —$SO_3 M$, where M represents a hydrogen atom or an alkali metal atom, such as Li, Na or K (preferably, M represents Na), and each occurrence of R, $R^A$, $R^B$ and $R^C$ independently represents a hydrogen atom or a methyl, ethyl, n-propyl, isopropyl, n-butyl, t-butyl, sec-butyl, n-pentyl or n-hexyl group, and R, for each occurrence, can also represent a polyethylene glycol radical of formula:

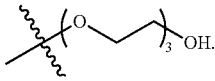

Advantageously, in the compound of formula (II), $R'_1$, $R'_2$, $R'_3$ and $R'_4$ independently represent —$N^+ R^A R^B R^C$, —$CO_2 M$ or —$SO_3 M$, where M represents an alkali metal atom, such as Li, Na or K (preferably, M represents Na), and each occurrence of $R^A$, $R^B$ and $R^C$ independently represents a hydrogen atom or a methyl, ethyl, n-propyl, isopropyl, n-butyl, t-butyl, sec-butyl, n-pentyl or n-hexyl group, and R, for each occurrence, can also represent a polyethylene glycol radical of formula:

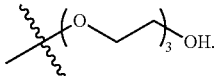

Advantageously, in the compound of formula (II), $R'_1$, $R'_2$, $R'_3$ and $R'_4$ independently represent a hydrogen atom, —$NR^A R^B$ or —OR, where each occurrence of R, $R^A$ and $R^B$ independently represents a hydrogen atom or a methyl, ethyl, n-propyl, isopropyl, n-butyl, t-butyl, sec-butyl, n-pentyl or n-hexyl group, and R, for each occurrence, can also represent a polyethylene glycol radical of formula:

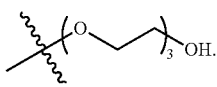

In variant, R'$_1$, R'$_2$, R'$_3$ and R'$_4$ independently represent a hydrogen atom or —NR$^A$R$^B$, and R$^A$ and R$^B$ independently represent a hydrogen atom or a methyl or ethyl group. In a variant, R'$_1$, R'$_2$, R'$_3$ and R'$_4$ independently represent a hydrogen atom or —NR$^A$R$^B$, and R$^A$ and R$^B$ each represent a hydrogen atom or a methyl or ethyl group. In a variant, R'$_1$, R'$_2$, R'$_3$ and R'$_4$ independently represent a hydrogen atom or —NR$^A$R$^B$, and R$^A$ and R$^B$ each represent a hydrogen atom. In a variant, R'$_1$, R'$_2$, R'$_3$ and R'$_4$ each represent a hydrogen atom.

Advantageously, the compound of formula (II) has the following formula:

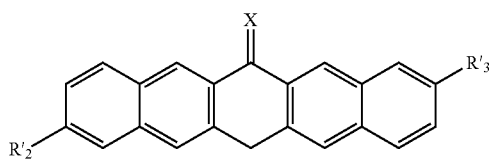

wherein X, R'$_2$ and R'$_3$ are as defined above, in all the alternative forms described above.

Advantageously, the compound of formula (II) has the following formula:

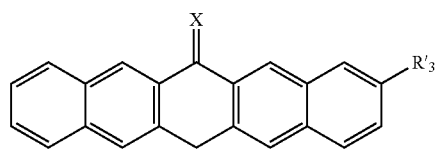

wherein X and R'$_3$ are as defined above, in all the alternative forms described above.

Advantageously, in the compounds of formula I or II, when at least one of the substituents represents —CO$_2$M or —SO$_3$M, M can represent Li, Na or K, preferably Na.

Advantageously, the compound of formula (I) corresponds to one of the following structures:

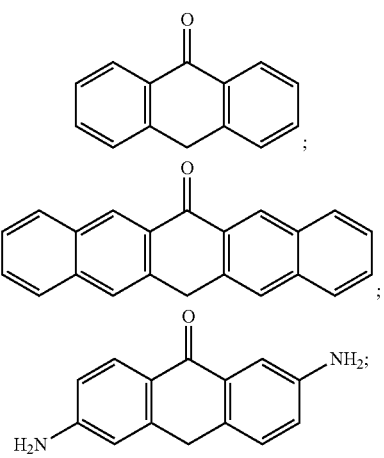

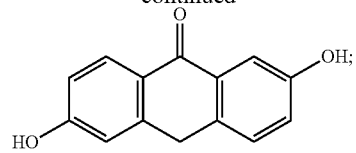

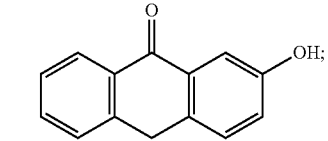

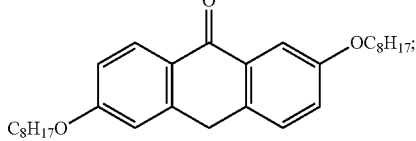

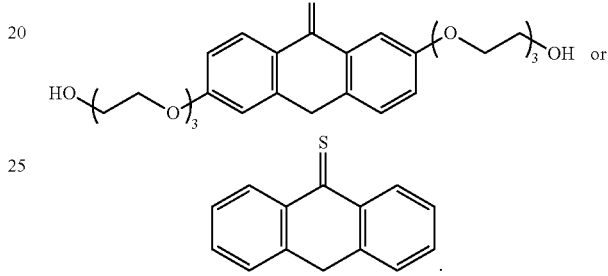

Advantageously, the organic solvent can be any organic solvent known to a person skilled in the art. It can, for example, be a saturated or unsaturated aliphatic or alicyclic hydrocarbon (such as n-hexane, n-heptane, n-octane, n-nonane, cyclohexane or methylcyclohexane), an aromatic hydrocarbon (such as benzene, chlorobenzene, 1,2-dichlorobenzene, toluene, o-xylene, m-xylene, p-xylene, ethylbenzene, cumene or mesitylene), an alcohol preferably comprising at least 3 carbon atoms (such as isopropanol, n-butanol, cyclohexanol), a glycol (such as ethylene glycol or propylene glycol), a halogenated hydrocarbon (such as dichloromethane, chloroform, trichloroethylene, 1,1,1-trichloroethane, carbon tetrachloride, perchloroethylene or 1,1,2-trichlorotrifluoroethane), a ketone (such as acetone, butanone, 2-pentanone, cyclohexanone, 4-methyl-2-pentanone, 2-heptanone or 2,6-dimethyl-4-heptanone), an ester (such as ethyl acetate, propyl acetate, isopropyl acetate, butyl acetate, isobutyl acetate, amyl acetate or 2-ethylhexyl acetate), an ether (such as tetrahydrofuran (THF), ethyl ether, methyl t-butyl ether, 1,4-dioxane, 1,2-dimethoxyéthane, anisole or 2,5,8-trioxanonane), a glycol ether (such as 1-methoxy-2-propanol, 2-butoxyethanol, 2-(2-methoxyethoxy)ethanol, 1-methoxy-2-propyl acetate, (2-methoxymethylethoxy)-propanol or tripropylene glycol monomethyl ether) or another organic solvent, such as acetonitrile, N-methyl-2-pyrrolidone (NMP) or dimethylformamide (DMF), or a mixture of two or more of these. Advantageously, preference will be given to organic solvents other than methanol or ethanol. Advantageously, an aromatic solvent, such as benzene, chlorobenzene, o-dichlorobenzene, and the like, can be used. For example, the organic solvent can be THF, acetonitrile, N-methyl-2-pyrrolidone (NMP), dimethylformamide (DMF), 2-propanol, toluene, benzene, chlorobenzene or 1,2-dichlorobenzene.

Advantageously, the solvent can be selected so that it can stabilize and dissolve the films of graphene or of Graphene Diels-Alder adduct obtained. In order to do this, it can be selected from polar aprotic solvents or aromatic solvents which are not too polar.

Advantageously, the base used can be any base known to a person skilled in the art which is soluble in the reaction medium. For example, it can be a di- or trialkylamine, such as diethylamine, dimethylamine, aza-crown ether, diisopropylamine, diisopropylethylamine, triethylamine, trimethylamine, tripropylamine, tributylamine, N-methylcyclohexylamine, N-ethylcyclohexylamine, N-methylcyclopentylamine or N-ethylcyclopentylamine. It can also be a nitrogenous aromatic base, such as pyridine, 2-methylpyridine, 3-methylpyridine, 4-methylpyridine or pyrimidine.

Advantageously, the process is carried out under at least one of the following techniques: sonication, ball-milling and high-shear mixing. These techniques, employed alone or in combination, make it possible to accelerate the exfoliation process.

Advantageously, the process is carried out solely under sonication. More advantageously, the sonication is supplemented by ball-milling and/or high-shear mixing. Sonication and ball-milling or sonication and high-shear mixing can be simultaneous or sequential, preferably sequential.

Advantageously, the sonication is a gentle sonication, that is to say a sonication which, by itself alone, does not make possible the exfoliation of the graphite.

Advantageously, the sonication is carried out using an ultrasonic bath operating at a frequency appropriate for carrying out gentle sonication, as defined above. The appliances provided for this purpose are well known to a person skilled in the art. For example, ultrasonic baths operating at 30 or 37 kHz can be used. Advantageously, the sonication power and time can be adjusted in order to make possible a gentle sonication, as defined above, while keeping intact the graphene sheets modified by Diels-Alder reaction according to the process of the invention. For example, the sonication power can be of the order of 40 to 150 W consumed and the sonication time can vary between 10 minutes and 5 hours.

Advantageously, the process according to the invention can be carried out at ambient temperature, that is to say from 20 to 25° C. A slightly higher temperature can also be advantageous, for example from 25 to 65° C. Typically, the process according to the invention can be carried out at a temperature of 20 to 65° C.

The Graphene Diels-Alder adduct obtained by the process according to the invention may be soluble or insoluble in the reaction medium, according to the size of the graphene sheets exfoliated. Thus, according to a variant, the process can additionally comprise a centrifuging step, the latter making it possible to separate any undissolved fraction from the solution obtained on conclusion of the process. A person skilled in the art will know how to determine the centrifuging conditions appropriate for obtaining a clear solution, that is to say a solution not comprising detectable aggregates. For example, the centrifuging can be carried out between 1000 and 5000 revolutions per minute, for 0.1 to 24 hours. Advantageously, the centrifuging step is carried out at 3000 revolutions per minute, for 30 minutes to 1 hour.

Advantageously, the presence of aggregates in the solution during the centrifuging is confirmed with the naked eye. Thus, a sample of the solution can be withdrawn at different time intervals in the centrifuging step in order to determine when the latter has made it possible to obtain a clear solution (that is to say a solution without aggregates visible to the naked eye). Examination with the naked eye makes it possible to detect possible aggregates having a minimum size of the order of a tenth of a millimeter (100 microns).

Advantageously, the presence of aggregates in the solution during the centrifuging is confirmed with an optical microscope. Thus, a sample of the solution can be withdrawn at different time intervals in the centrifuging step in order to determine when the latter has made it possible to obtain a clear solution (that is to say, a solution without aggregates visible to an optical microscope). Examination with an optical microscope makes it possible to detect possible aggregates having a minimum size of the order of a micron. In a specific embodiment, the sample of the solution can be analyzed with an optical microscope having a magnification of 20 to 100.

According to a variant, the process can additionally comprise a step of filtering the supernatant obtained on conclusion of the centrifuging in order to isolate the Diels-Alder adduct ("DA" adduct) of graphene which is chemically modified obtained by the process, whether or not the latter is soluble in the reaction medium (if soluble or partially soluble, the supernatant is recovered: if insoluble or partially insoluble, the insoluble fraction is recovered). For example, after the filtering step, in the case where the DA adduct is insoluble or partially soluble, the latter can be rinsed with the same solvent used during the process. The adduct, thus rinsed, can optionally be dried.

The ball-milling can be carried out by any technique and instrument known to a person skilled in the art. For example, reference may be made to Zhao, W., Fang, M., Wu, F., Wu, H., Wang, L. and Chen, G. Preparation of graphene by exfoliation of graphite using wet ball-milling. *J. Mater. Chem.*, 20, 5817-5817 (2010) [ref. 17].

The high-shear mixing can be carried out by any technique and instrument known to a person skilled in the art. For example, reference may be made to *Nature Materials*, 2014, 13, 624-630) [ref. 18].

Once the Graphene Diels-Alder adduct has been obtained and isolated, the exfoliated graphene sheets (in the Diels-Alder adduct form) can be subjected to an annealing in order to reverse the Diels-Alder reaction (retro-Diels-Alder reaction) and to thus obtain graphene as such (monolayer sheets, multilayer sheets of 2 to 5 sheets or a mixture of these). Thus, advantageously, the process can additionally comprise a step of annealing the Graphene Diels-Alder adduct under vacuum to obtain graphene as such. This annealing step can be carried out, for example, at a temperature of 150 to 200° C., preferably 160 to 180° C. Advantageously, the annealing step can be carried out under vacuum, for example at a reduced pressure of less than or equal to 1.33322 Pa ($\leq 0.01$ mmHg), preferably between $1.33322 \times 10^{-3}$ Pa ($10^{-5}$ mmHg) and 1.33322 Pa ($\leq 0.01$ mmHg).

The graphene thus obtained may exist in the form of monolayer sheets or of multilayer sheets of a few sheets (2 to 5), or a mixture of these.

Advantageously, the DA adduct may be soluble or partially soluble in the reaction medium and may be present at least partially in the supernatant. To obtain Graphene DA adduct in the form of solutions is of great advantage for their industrial applications, in particular for their shaping for the purpose of a given use. This is because such solutions can be easily used to deposit planes of Graphene DA adduct on a given substrate, in order to form films of adduct of graphene, or to prepare, by impregnation, composites including graphene. This is because, once the Graphene DA adduct has been deposited on said substrate, the latter can be subjected to an annealing to obtain graphene sheets (by retro-Diels- Alder reaction), as described above. These solutions also open the way to the purification of the graphene.

Generally, the process of the invention can be employed with or without stirring. When a stirring system is used, it can be a system of mechanical stirring, of magnetic stirring or of stirring by sonication. In a specific embodiment, the process is carried out under mechanical stirring. In another embodiment, the process is carried out under magnetic stirring. Advantageously, the process of the invention can be carried out without other stirring system than sonication.

Advantageously, when the Graphene DA adduct is soluble in the reaction medium, the process according to the invention additionally comprises a step of deposition of planes of Graphene DA adduct on a given substrate. Preferably, this deposition is carried out under an inert atmosphere. Once the deposition has been carried out and the solvent removed, the substrate can be subjected to an annealing under vacuum: the graphene sheets are then in interaction with the surface and remain stabilized on the surface.

The deposition can be carried out by simple deposition of an amount of solution of Graphene DA adduct on a substrate, followed by the evaporation of the solvent used in order to isolate the planes of Graphene DA adduct. For example, the solution of Graphene DA adduct according to the invention can be deposited on a given substrate and the solvent can be evaporated under an inert atmosphere. Planes of Graphene DA adduct deposited on the substrate can thus be obtained, once the polar aprotic solvent has evaporated.

The deposition of Graphene DA adduct can also be carried out by deposition by application, for example with a brush or another instrument which makes possible the deposition of a film of solution of Graphene DA adduct on a given substrate.

The deposition of Graphene DA adduct can also be carried out by dip coating. For example, the substrate can be dip coated in the solution of Graphene DA adduct for a certain time in order to make possible the adsorption of the planes of Graphene DA adduct on the surface of the substrate. The substrate is subsequently withdrawn from the solution, preferably at a uniform rate to obtain a uniform coating, and the solvent is evaporated.

The deposition of Graphene DA adduct can also be carried out by spin coating. For example, a drop of solution of Graphene DA adduct can be deposited on a rotating substrate, optionally at high temperature. Preferably, the rotational speed is kept constant during the process, so as to obtain a uniform deposited layer, and the solvent is evaporated. When the spin coating is carried out at high temperature, said temperature can be between 10 and 200° C. When the temperature is of the order of 80-200° C., the Graphene DA adduct can undergo a retro-Diels-Alder reaction to give graphene as such.

The deposition of Graphene DA adduct can also be carried out by drop casting of a drop of solution. For example, a drop of solution of Graphene DA adduct can be deposited on a substrate. The drop of solvent is subsequently evaporated, optionally at a high temperature, depending on the solvent to be evaporated.

Such methods are known to a person skilled in the art, who will know how to adjust the processing conditions according to the parameters, such as the nature of the substrate, the interactions between the substrate and the graphene sheets, the wettability of the substrate by the solvent, and other parameters, the relevance of which will be recognized by a person skilled in the art.

Suitable substrates include, nonexhaustively, ceramics, metals, glass, silica, mica, graphite and/or plastics. In one embodiment, the substrate can be any known substrate used and/or appropriate for the deposition of carbon nanotubes or graphene sheets. For example, the substrate can be HOPG (highly oriented pyrolytic graphite), $Si/SiO_2$ or mica.

The present invention also provides graphene obtainable by a process according to the invention.

The present invention also provides a Graphene Diels-Alder adduct obtainable by a process according to the invention.

The present invention also provides graphene obtainable by a process according to the invention. The graphene can exist in the form of isolated graphene sheets and/or of graphene ribbons. For example, the graphene sheets can be deposited on a substrate or mixed with another material.

The present invention also relates to the use of the graphene obtainable by the process according to the invention in the preparation of composite materials.

Advantageously, the composite material can be obtained by a process comprising a step of mixing graphene obtainable by a process according to the invention and a solution of polymer or of a blend of polymers. For the implementation of this aspect of the invention, the reader may refer, for example, to the content of the document WO 2009/056696 and adapt the teaching thereof. The content of the document WO 2009/056696 is explicitly incorporated in the present document by reference, in particular the passages from page 18, line 12 to page 24, line 2, and the references which are cited therein.

Advantageously, the graphene obtainable by the process of the invention can be used in the manufacture of electronic or microelectronic components, such as capacitors or transistors.

Also advantageously, the graphene obtainable by the process of the invention can be used in the manufacture of transparent conducting electrodes, of OLED electroluminescent devices or of organic or hybrid photovoltaic cells.

The inventors of the present invention are the very first to have elaborated a process for the preparation of graphene by exfoliation of graphite assisted by a Diels-Alder reaction.

Advantageously, the graphite can originate from any source of carbon-based material capable of containing graphite. Of course, the process according to the invention can be carried out on graphite, for example HOPG (highly oriented pyrolytic graphite) or amorphous or crystalline graphite. The process according to the invention can also be carried out on carbon black, which is known to contain a high proportion of graphite. Carbon black is used on a large scale in the manufacture of batteries and conducting components. Its use starting from suspensions in a liquid is of industrial advantage in facilitating the shaping of products but requires the dispersion of the carbon black. The process according to the invention makes possible precisely the stabilization of suspensions of carbon black having a high graphite content.

This invention thus opens two promising routes for the field of graphene: the availability of graphene sheets opens up huge prospects in the preparation of composite materials by mixing with polymers or polymerization with graphene. Depositions of graphene sheets on a substrate, which are easily feasible on a large scale by virtue of the present invention, may henceforth become a routine and make possible a true exploration of the electronics of graphene by means of depositions controlled by self-assembling, field deposition, and the like.

As a person skilled in the art may observe on reading the present description, one of the main advantages of the present invention is the simplicity of the implementation of the process, and also its fitness in providing unlimited amounts of graphene sheets. The process according to the invention also makes it possible to obtain graphene sheets of high quality with few defects in solvents supposed until now to be not very favorable to the dissolution of graphene (tetrahydrofuran, acetonitrile). This opens up numerous prospects, in particular:

1) In electronics: in particular in the manufacture of transparent conducting substrates which can replace transparent electrodes based on semiconducting oxides in electroluminescent and photovoltaic devices. The process according to the invention might be used in the manufacture of a new generation of ultrafast transistors, of nanometric size. This is because graphene exhibits unusual properties resulting from its highly delocalized electronic structure. In graphene, the separation between the conduction band and the valence band can be adjusted by varying the density of the defects, which makes it possible to change from a fully conducting material to a semiconducting material.

Depending on the electronic nature of the graphene, it may have application in the manufacture of transparent conducting electrodes as replacement for ITO in the manufacture of flat screens, OLED electroluminescent devices or organic or hybrid photovoltaic cells. In the semiconducting form, it may be used as active layer in organic transistors (OFETs) and sensors.

Furthermore, the theoretical electron mobility is 200 000 $cm^2 \cdot V^{-1} \cdot s^{-1}$, which means that this material is particularly attractive in high frequency and terahertz electronics (As the graphene is a two-dimensional crystal, the electrons move over the graphene at a speed of 1000 $km \cdot s^{-1}$, i.e. nearly 150 times the speed of electrons in silicon (7 $km \cdot s^{-1}$)).

2) Fundamental physics: One of the most spectacular properties of graphene is to possess electrons in the Fermi level for which the apparent mass is zero and to thus constitute the only physical system displaying fermions of zero mass, which is of very great interest for research. One of the most striking effects is the appearance under a magnetic field of a quantum Hall effect at ambient temperature.

3) Other applications (lubrication, composite polymers, oxygen-protection barrier films) resulting from the mechanical properties of graphene are also possible. This is because, in particular in the field of materials, measurements have established that graphene has a tensile strength 200 times greater than that of steel and that it is 6 times lighter. Addition of graphene to a polymer makes it possible to increase the hardness and the thermal stability of the polymer.

4) Applications in the manufacture of graphene-based hybrid materials containing metal sites (transition metal complexes, metal nanoparticles) can also be envisaged by employing the process according to the invention with thioanthrone and thiopentacenone derivatives. This is because the thiol functional group released by a Diels-Alder reaction with the graphite makes it possible to complex the metal site. These materials are advantageous in applications in catalysis, in imaging and in analysis.

The process provided is particularly advantageous as it involves a chemical modification of the graphene which is fully reversible and makes it possible to retain the electronic structure of graphene after carrying out the process. This process makes it possible to use conditions for exfoliation of the graphite by ultrasound which are milder (in terms of time and power) and to obtain dispersions of graphene in solvents which are supposed to be difficult (THF, acetonitrile) but which are advantageous in the formulation of inks and in the deposition on flexible or large-sized substrates. The compounds used are either commercially available or are accessible in a few steps starting from commercially available compounds.

For examples of implementation of the abovementioned uses, the reader may refer to references 4 to 11 cited in the List of the References.

Other advantages may also appear to a person skilled in the art on reading the examples below, illustrated by the appended figures, given by way of illustration.

BRIEF DESCRIPTION OF THE FIGURES

FIG. 8: A Mapping carried out over regions of approximately 10 μm², in 2 μm steps, of a solution of graphene in THF obtained in example 9. B DIC (Differential Interference Contrast)/Raman spectrum at λ=568 nm, corresponding to the sample of FIG. 8A. C Mapping carried out over regions of approximately 10 μm², in 6 μm steps, of a solution of graphene in THF obtained in example 9. D DIC (Differential Interference Contrast)/Raman spectrum at λ=568 nm, corresponding to the sample of FIG. 8B.

EXAMPLES

Figure 1A:
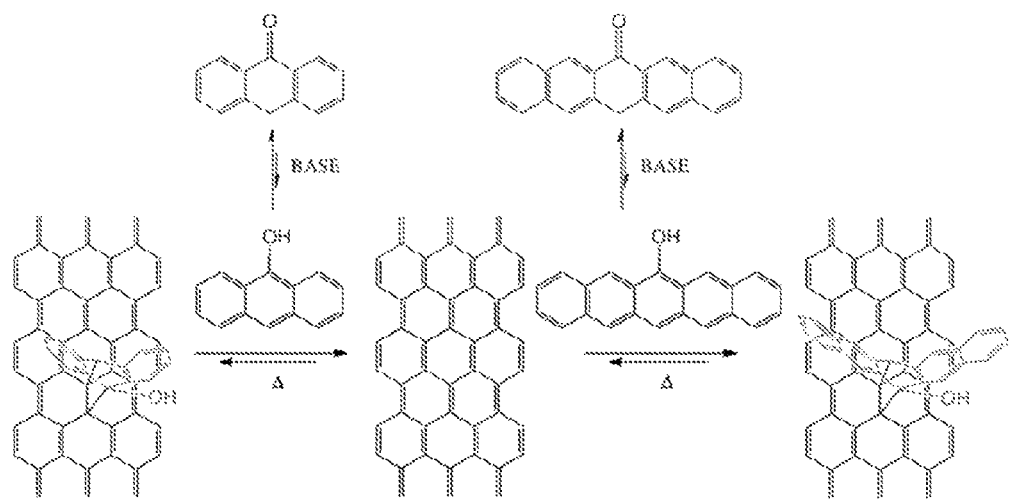
FIG. 1 represents a diagram of the keto-enol equilibrium of anthrone (left) and of 6,6-dihydropentacen-13-one (right), respectively giving anthracenol and pentacenol, and reaction of the latter with the dienophile sites of the graphene sheets.
Figure 1B:
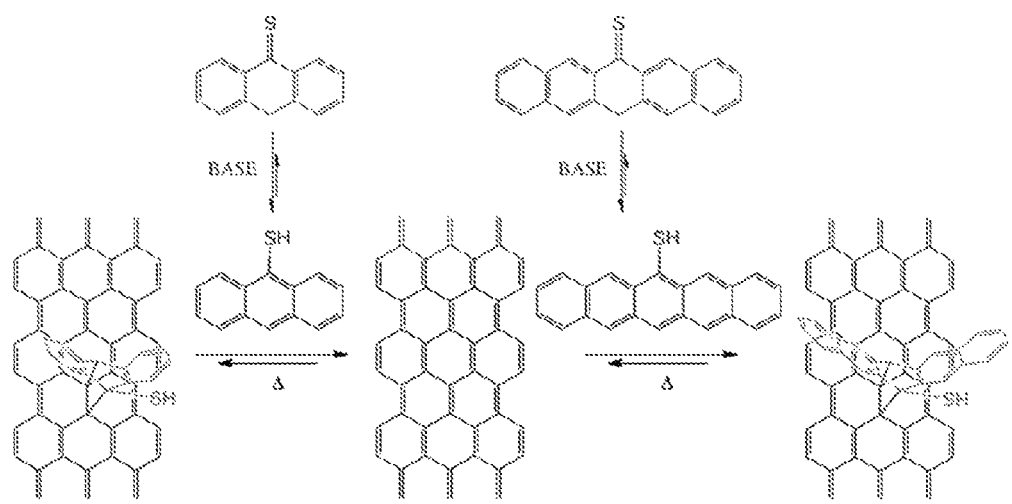
Figure 2:
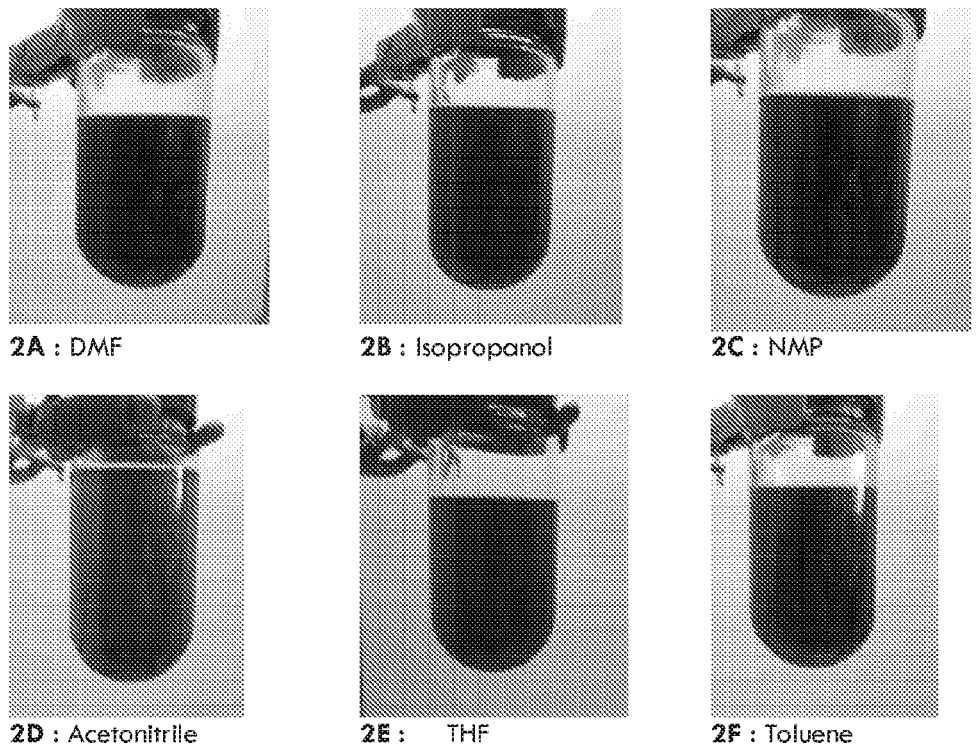
FIG. 2 illustrates photographs of the samples obtained in examples 1 to 3 after centrifuging.
Figure 3:
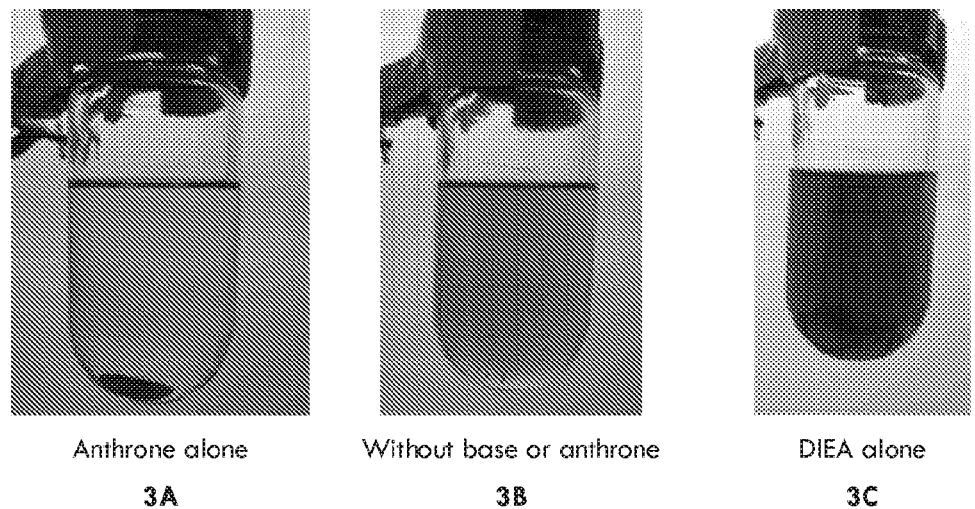
FIG. 3 represents additional experiments without base (3A), without anthrone (3C) and without anthrone or base (3B) in THF: 4 h of sonication and 30 min of centrifuging at 3000 rpm.
Figure 4:
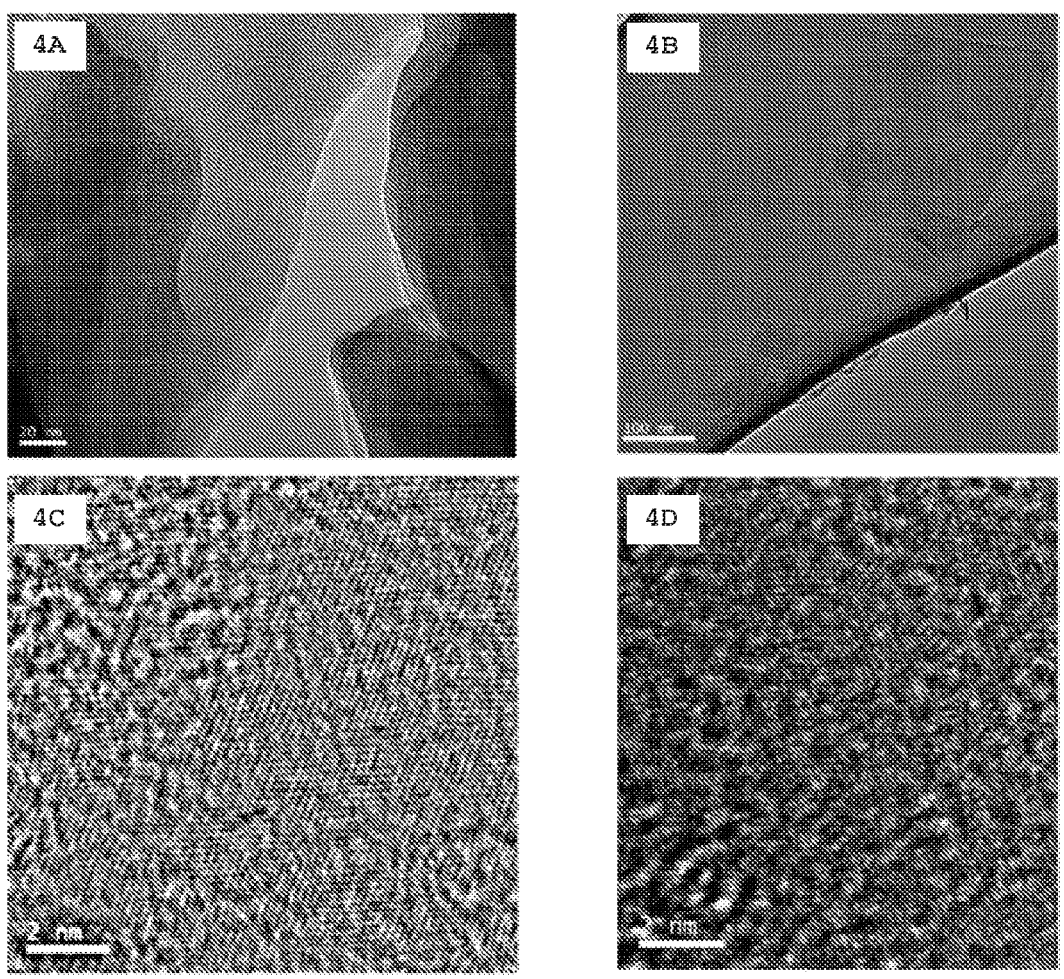
FIG. 4 represents TEM (Transmission Electron Microscopy) images of sheets of Graphene Diels-Alder adduct obtained by the use of anthrone (4A and 4C) or pentacenone (4B and 4D), as shown in examples 1 and 2 respectively.
Figures 5A, 5B:
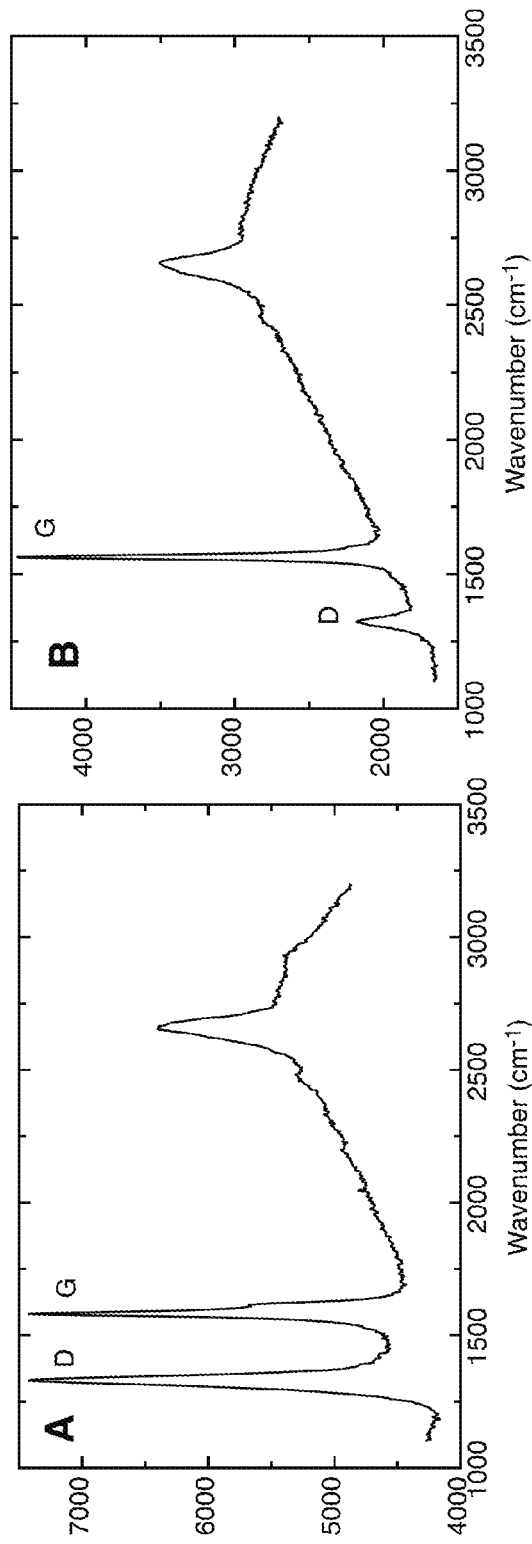
FIG. 5: A: Raman spectrum of a sample of graphite exfoliated according to the process of the invention using anthrone of formula I ($R_1$-$R_4$=H, solvent=THF, base=diisopropylethylamine) deposited on a glass slide and dried in the air. B: Raman spectrum of a sample of graphite exfoliated according to the process of the invention using anthrone of formula I ($R_1$-$R_4$=H, solvent=THF, base=diisopropylethylamine) deposited on a glass slide and dried in the air after annealing at 200° C. under vacuum for 60 min. The intensity of the D band is proportional to the presence of defects ($sp^3$ C atoms). The $I_D/I_G$ ratio can thus be used to deduce therefrom the content of defects (borders of the sheets, DA adducts, or other). It is seen that $I_D/I_G$ is high (approximately 1) after exfoliation and that it substantially decreases ($I_D/I_G$=0.14) if heating is carried out. The defects decrease because the Diels-Alder reaction is reversible and the graphene is reformed. A film of graphene sheets with few defects is thus obtained. The residual defects can be due to the edge effects or to the presence of minor defects produced during sonication.

Example 1: Preparation of Compounds of Formula (I)

1) 2,6-Diaminoanthracen-9(10H)-one

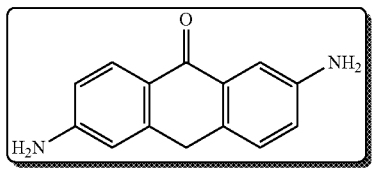

2,6-Diaminoanthracen-9(10H)-one is synthesized from commercial 2,6-diaminoanthracene-9,10-dione using a method of reduction with tin (Sn) (Tetrahedron Letters, 2011, 52, 5083). The yield is 80% after purification.

$^1$H NMR (300 MHz, DMSO) δ (ppm)=7.86 (d, J=8.4 Hz, 1H), 7.31 (d, J=2.5 Hz, 1H), 7.15 (d, J=8.3 Hz, 1H), 6.83 (dd, J=8.5 Hz; 2.6 Hz, 1H), 6.61 (dd, J=8.5 Hz; 2.2 Hz, 1H), 6.52 (d, J=2.1 Hz, 1H), 6.04 (s, 2H), 5.19 (s, 2H), 4.04 (s, 2H).

$^{13}$C NMR (75 MHz, DMSO) δ (ppm)=181.684, 152.93, 147.195, 143.639, 132.454, 128.898, 127.694, 120.658, 119.052, 113.26, 110.545, 109.761, 30.974

HRMS (+TOF MS). Found: [M+Na] 247.0841. Calculated: 247.0841

2) 2,6-Dihydroxyanthracen-9(10H)-one

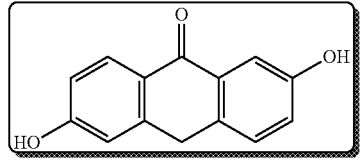

2,6-Dihydroxyanthracen-9(10H)-one is synthesized from commercial 2,6-dihydroxyanthracene-9,10-dione by using a method of reduction with tin chloride in an acid medium (Tetrahedron Letters, 2003, 44, 945-948). The yield is 65% after purification.

$^1$H NMR (300 MHz, DMSO) δ (ppm)=8.35 (d, J=8.1 Hz, 1H), 8.30 (d, J=8.6 Hz, 1H), 7.58 (td, J=7.4 Hz; 1.9 Hz, 1H), 7.46 (m, 2H), 6.94 (dd, J=8.7 Hz; 2.4 Hz, 1H), 6.90 (d, J=2.1 Hz, 1H), 4.315 (s, 2H).

$^{13}$C NMR (75 MHz, DMSO) δ (ppm)=182.086, 161.629, 156.104, 143.983, 132.493, 131.307, 129.969, 129.319, 123.641, 120.926, 115.382, 113.891, 111.271, 31.031.

HRMS (CI-DEP). Found: [M-H]$^+$=227.07065. Calculated: 227.07082.

3) 2,6-Bis(octyloxy)anthracen-9(10H)-one

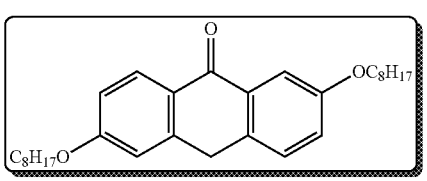

2,6-Bis(octyloxy)anthracen-9(10H)-one is synthesized from 2,6-bis(octyloxy)anthracene-9,10-dione by the use of activated zinc in a basic medium (*Helvetica Chimica Acta*, 2006, 89, 333). The yield is 99%.

$^1$H NMR (300 MHz, CDCl$_3$) δ (ppm)=8.34 (d, J=8.8 Hz, 1H), 7.8 (d, J=2.8 Hz, 1H), 7.33 (d, J=8.5 Hz, 1H), 7.15 (dd, J=8.5 Hz; 2.8 Hz, 1H), 6.98 (dd, J=8.8 Hz; 2.5 Hz, 1H), 6.88 (d, J=2.6 Hz, 1H), 4.23 (s, 2H), 4.06 (q, J=6.1 Hz, 4H), 1.82 (m, 4H), 1.48 (m, 4H), 1.30 (m, 16H), 0.89 (m, 6H).

$^{13}$C NMR (75 MHz, CDCl$_3$) δ (ppm)=183.382, 162.887, 158.318, 133.177, 132.737, 130.061, 129.564, 125.510, 121.840, 114.689, 112.548, 109.776, 68.480, 32.155, 31.964, 29.479, 29.364, 29.307, 26.152, 22.802, 14.241.

HRMS (FD+). Found: [M+] 450.31151. Calculated: 450.31339

4) 2-Hydroxyanthracen-9(10H)-one

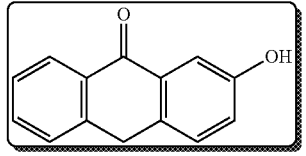

2-Hydroxyanthracen-9(10H)-one is synthesized from 2-hydroxyanthracene-9,10-dione by the method of reduction with tin chloride in an acid medium (Tetrahedron Letters, 2003, 44, 945-948).

$^1$H NMR (300 MHz, DMSO) δ (ppm)=8.35 (d, J=8.1 Hz, 1H), 8.30 (d, J=8.6 Hz, 1H), 7.58 (td, J=7.4 Hz; 1.9 Hz, 1H), 7.46 (m, 2H), 6.94 (dd, J=8.7 Hz; 2.4 Hz, 1H), 6.90 (d, J=2.1 Hz, 1H), 4.315 (s, 2H).

$^{13}$C NMR (150 MHz, DMSO) δ (ppm)=181.976, 161.816, 143.582, 140.637, 132.340, 131.494, 129.343, 128.709, 123.642, 115.447, 113.850, 31.675.

HRMS (FD+). Found: [M+] 210.06762. Calculated: 210.06808

5) 2,6-Bis(2-(2-(2-hydroxyethoxy)ethoxy)ethoxy)anthracen-9(10H)-one

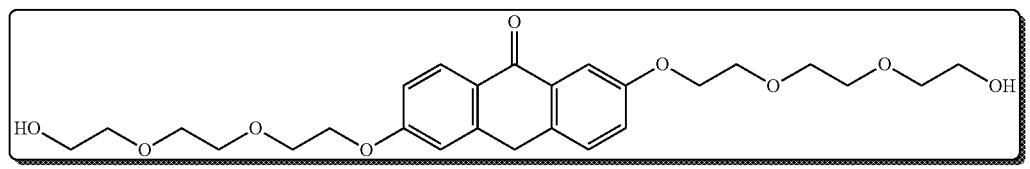

2,6-Bis(2-(2-(2-hydroxyethoxy)ethoxy)-ethoxy)anthracen-9(10H)-one is synthesized by reduction of 2,6-bis(2-(2-(2-hydroxyethoxy)ethoxy)ethoxy)anthracene-9,10-dione (*Eur. J. Org. Chem.*, 2000, 591), with sodium borohydride, followed by dehydration in an acid medium. At the end of the reaction, a mixture of anthrone, anthraquinone and anthracene is obtained. Separation was not possible and the product is used directly.

LRMS (+TOF MS): [M+Na]=513.2

6) Thioanthrone

1) Starting from 9-bromoanthracene in diethyl ether, the corresponding lithium derivative is formed by addition of n-BuLi at 0° C. and then addition of inorganic sulfur makes it possible to form 9-anthracenethiol (Asian Journal of Organic Chemistry, 2012, 1, 274).
2) Starting from anthrone, by reaction with Lawessons reagent in toluene at 80° C. After treatment, the compound recovered is 9-anthracenethiol (in "keto-enol" equilibrium with the thioanthrone compound).

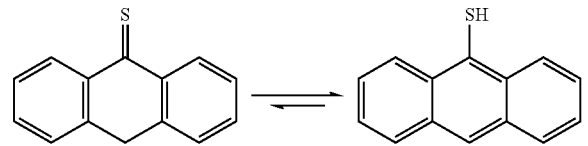 [SMILES: S=C1c2ccccc2Cc2ccccc21 ; Sc1c2ccccc2cc2ccccc12]

According to the NMR of the crystalline product, the two entities are present in solution. The predominant product in solution is the anthracenethiol:

$^1$H NMR (400 MHz, CDCl$_3$) δ (ppm)=8.63 (dd, J=8.9 Hz; 1.4 Hz, 2H), 8.38 (s, 1H), 8.00 (dd, J=8.4 Hz; 1.4 Hz, 2H), 7.59 (ddd, J=8.9 Hz; 6.6 Hz; 1.4 Hz, 2H), 7.50 (ddd, J=8.4 Hz; 6.6 Hz; 1.4 Hz, 2H), 3.68 (s, 1H).

$^{13}$C NMR (100 MHz, CDCl$_3$) δ (ppm)=129.122, 127.132, 126.484, 126.255, 125.449.

LRMS: [M+]=210.0
HRMS (CI-DEP). Found: [M-H]+=211.05785. Calculated: 211.05815.

Example 2: Exfoliation of Graphite by Virtue of a Diels-Alder Reaction Using Anthrone Anthrone of Formula I:

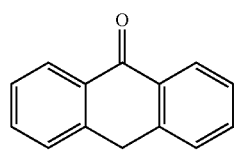 [SMILES: O=C1c2ccccc2Cc2ccccc21]

(200 mg, 1.03 mmol), graphite powder (100 mg), N,N-diisopropylethylamine (30 mg, 0.23 mmol) and THF (50 ml) are introduced into a 100 ml centrifuge tube. The mixture is subjected to ultrasound in an ultrasonic bath (30 kHz, 150 W) for 4 hours and then centrifuged at a speed of 3000 revolutions per minute for 30 minutes in order to separate the unexfoliated graphite. The supernatant is then withdrawn using a pipette and then filtered through a nylon filter (diameter of the pores 0.22 μm), which had been dried and weighed beforehand. The whole (filter and residue) is then dried and then weighed. A weight of Graphene Diels-Alder adduct of 1.0 mg is thus obtained, i.e. a concentration of 0.02 mg·ml$^{-1}$ of Graphene Diels-Alder adduct in suspension in the supernatant.

Example 3: Exfoliation of Graphite by Virtue of a Diels-Alder Reaction Using Anthrone Derivatives Method: 100 mg of graphite, 50 mg of anthrone derivative product and 25 mg of DIPEA (diisopropylethylamine) are dissolved in 50 ml of THF (C$_{graphite}$=2 mg/ml) and subjected to ultrasound at 60-65° C. for 4 h (180 W, 37 kHz) in an ultrasonic bath. The mixture is then centrifuged at 3000 rpm for 30 minutes and then left to separate by settling for 24 h. The supernatant is subsequently withdrawn and then filtered through nylon filters (size of the pores 0.22 μm). The solid obtained is thus redispersed in 10 ml of THF.

Figure 6A:
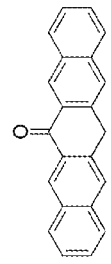
FIG. 6: A Table compiling the graphene concentrations obtained in THF in example 3. B Corresponding photographs of the various samples obtained.
Figure 6B:
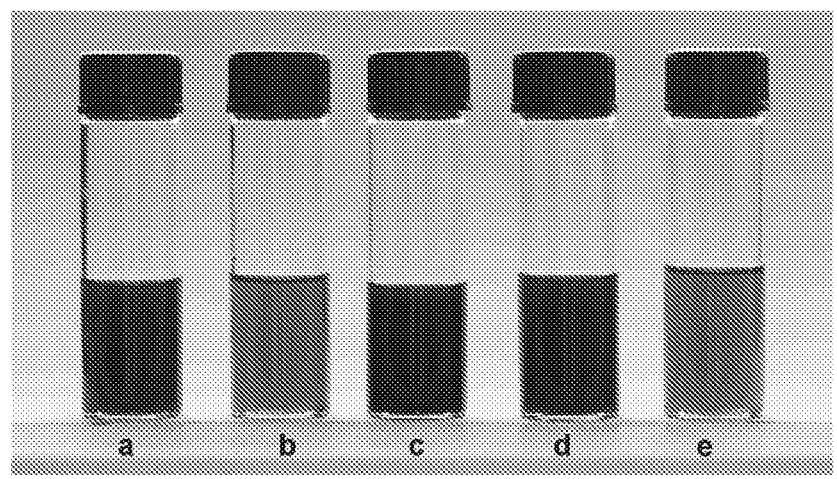
Figure 7:
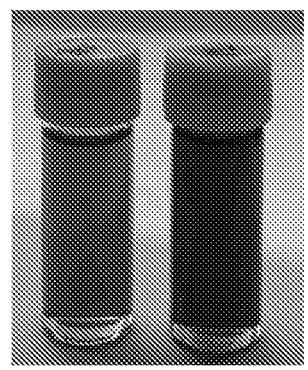
FIG. 7: Solutions obtained in example 6 (X=S) after filtration and redispersion in THF (on the left, C=0.0335 mg/ml) and in toluene (on the right, C=0.0495 mg/ml).

The results are listed in FIGS. 6A and 6B.

Example 4: Exfoliation of Graphite by Virtue of a Diels-Alder Reaction Using 6,6-dihydropentacen-13-one 6,6-Dihydropentacen-13-one of formula II:

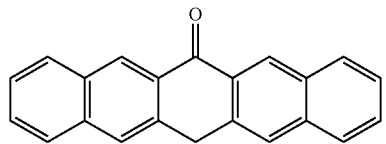 [SMILES: O=C1c2cc3ccccc3cc2Cc2cc3ccccc3cc21]

(10 mg, 0.034 mmol), graphite powder (100 mg), N,N-diisopropylethylamine (1 mg, 0.0077 mmol) and THF (50 ml) are introduced into a 100 ml centrifuge tube. The mixture is subjected to ultrasound in an ultrasonic bath (37 kHz, 150 W) for 4 hours and then centrifuged at a speed of 3000 revolutions per minute for 30 minutes in order to separate the unexfoliated graphite. The supernatant is then withdrawn with a pipette and then filtered through a nylon filter (diameter of the pores 0.22 μm) dried and weighed beforehand. The combination (filter and filtrate) is then dried and then weighed. A weight of Graphene Diels-Alder adduct of 0.7 mg is thus obtained, i.e. a concentration of 0.014 mg·ml$^{-1}$ of Graphene Diels-Alder adduct in suspension in the supernatant.

Example 5

The experimental protocol of example 2 was repeated with different solvents. The results obtained with anthrone are listed in table 1, including the results of example 2 with THF.

TABLE 1

Weight and concentration of Graphene Diels-Alder adduct which are obtained as a function of solvent used during the exfoliation of graphite with anthrone (200 mg) in the presence of DIPEA (20 mol %)

|  | THF | Acetonitrile | NMP | DMF | 2-Propanol | Toluene |
|---|---|---|---|---|---|---|
| Weight of Graphene Diels-Alder adduct (mg) | 1.0 | 0.75 | 1.5 | 2.2 | 0.5 | 1.4 |

TABLE 1-continued

Weight and concentration of Graphene Diels-Alder adduct which are obtained as a function of solvent used during the exfoliation of graphite with anthrone (200 mg) in the presence of DIPEA (20 mol %)

|  | THF | Acetonitrile | NMP | DMF | 2-Propanol | Toluene |
|---|---|---|---|---|---|---|
| Concentration of Graphene Diels-Alder adduct (mg · ml$^{-1}$) | 0.02 | 0.015 | 0.03 | 0.044 | 0.01 | 0.028 |

Example 6: Exfoliation of Graphite by Virtue of a Diels-Alder Reaction Using Thioanthracenone By analogy with anthrone, the use of sulfur-comprising derivatives for carrying out the exfoliation of graphite by a Diels-Alder reaction proves to be advantageous for the subsequent functionalization of the exfoliated graphene.

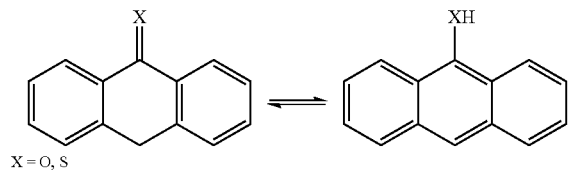

X = O, S

Method:

100 mg of graphite, 100 mg of anthracenethiol and 20 mg of DIPEA are dissolved in 50 ml of solvent ($C_{graphite}$=2 mg/ml) and subjected to ultrasound at 60-65° C. (180 W, 37 kHz) in an ultrasonic bath for 4 h. The mixture is then centrifuged at 3000 rpm for 30 minutes and then left to separate by settling for 24 h. The supernatant is subsequently withdrawn and then filtered through nylon filters (size of the pores 0.22 µm). The solid obtained is thus redispersed in 10 ml of solvent.

|  | X = S | | X = O | |
|---|---|---|---|---|
|  | THF | Toluene | THF | Toluene |
| Weight (mg) | 1.34 | 1.98 | 1.0 | 1.4 |
| Concentration (mg · ml$^{-1}$) | 0.268 | 0.0396 | 0.02 | 0.028 |

Example 7: Exfoliation of Graphite by Virtue of a Diels-Alder Reaction Using 2,6-bis(2-(2-(2-hydroxyethoxy)ethoxy)ethoxy)anthracen-9(10H)-one In order to improve the process for the exfoliation of the graphite via the Diels-Alder reaction with an anthrone-type compound, use was made of 2,6-bis(2-(2-(2-hydroxyethoxy)ethoxy)ethoxy)anthracen-9(10H)-one. The latter exhibits two (PEG)$_3$ chains with an end hydroxyl functional group, which is targeted at improving the exfoliation in alcoholic and/or aqueous media.

Method:

100 mg of graphite, 50 mg of anthrone-derived product (crude) and 25 mg of DIPEA are dissolved in 50 ml of solvent ($C_{graphite}$=2 mg/ml) and subjected to ultrasound at 60-65° C. (180 W, 37 kHz) in an ultrasonic bath for 4 h. The mixture is then centrifuged at 3000 rpm for 30 minutes and then left to separate by settling for 24 h. The supernatant is subsequently withdrawn and then filtered through nylon filters (size of the pores 0.22 µm). The solid obtained is thus redispersed in 10 ml of solvent.

IPA: Isopropanol (2-Propanol)

|  | IPA (100%) | IPA/H$_2$O (75/25) |
|---|---|---|
| Weight (mg) | 2.21 | 1.87 |
| Concentration (mg/ml) | 0.0442 | 0.0374 |

Comparative Example 8

The quality and the characteristics of the graphene sheets obtained by the process of the invention (for example in examples 1 to 7) can be compared with those of known processes, such as:

powerful sonication (much more powerful than that recommended for the process of the present invention). This method typically gives damaged graphene multilayer sheets;

or to proceed for oxidation/reduction of the graphite.

For example, use may be made of the experimental protocol described in reference 11 (Tagmatarchis et al., 2012).

Reference may also be made to the following protocol:

High intensity sonication (tipsonication) is carried out with a Bandelin Sonoplus HD 3200 ultrasonic homogenizer equipped with a flat head probe (VS70T), operating at 10% of the maximum power (250 W). In a typical experiment, 50 mg of graphite flakes are added per 100 ml of solvent [N,N-dimethylformamide (DMF), tetrahydrofuran (THF), dimethyl sulfoxide (DMSO), pyridine, o-dichlorobenzene (O-DCB) or N-methyl-1,2-pyrrolidone (NMP)]. The mixture is subjected to ultrasound for different periods of time (5, 15, 30 and 60 minutes). The graphene dispersion ink obtained is centrifuged for 15 min and the supernatant is collected and analyzed. On the basis of these measurements and calculations, the concentration of exfoliated graphene after high intensity sonication in O-DCB for 60 min was judged to be 17.8 mg·ml$^{-1}$, whereas the concentration of the dispersion of exfoliated graphene in NMP was measured at 3.8 mg·ml$^{-1}$.

The graphene obtained by the process of the invention (exfoliation of graphite assisted by a Diels-Alder reaction+ annealing under vacuum) and by the abovementioned known methods can be characterized by Raman spectroscopy and TEM. The graphene obtained by the process of the invention should contain fewer defects and thus be characterized by the usual spectroscopic (UV/vis absorption, Raman) and microscopic (AFM, SEM, TEM) techniques.

Example 9: Characterization by Raman Spectroscopy of the Graphene Exfoliated by the Diels-Alder Reaction With Anthrone Derivatives DIC (Differential Interference Contrast)/Raman study at λ=568 nm (60× lens)

This method consists in deriving the contrast of the refractive index differences of the components of the sample. This converts the phase difference of the light, induced by the refractive index of the sample, by detectable differences in amplitude. The advantage of this experiment is that an object would appear bright on a dark background but without the diffraction halo associated with a phase contrast. This process uses the differences in optical path length in the sample to generate the contrast; thus, the three-dimensional appearance of the samples on the image may not represent reality.

Samples were prepared by spin coating on glass slides starting from a solution of graphene in THF. The solution used is a solution resulting from the redispersion of the graphene after filtration.

Figures 8A, 8B:
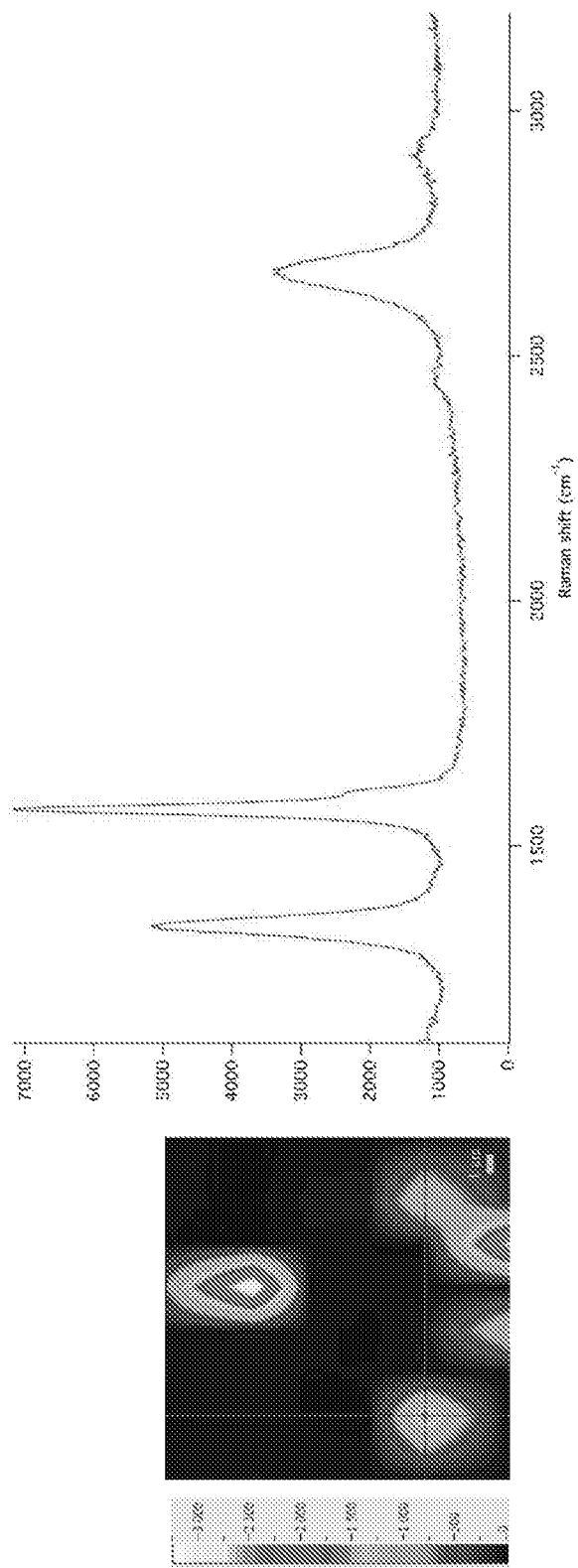
In FIGS. 8A and 8C, the difference in color represents the differences in intensity of the G band, at 1578 $cm^{-1}$. The wavelength used is 568 nm.
Figures 8C, 8D:
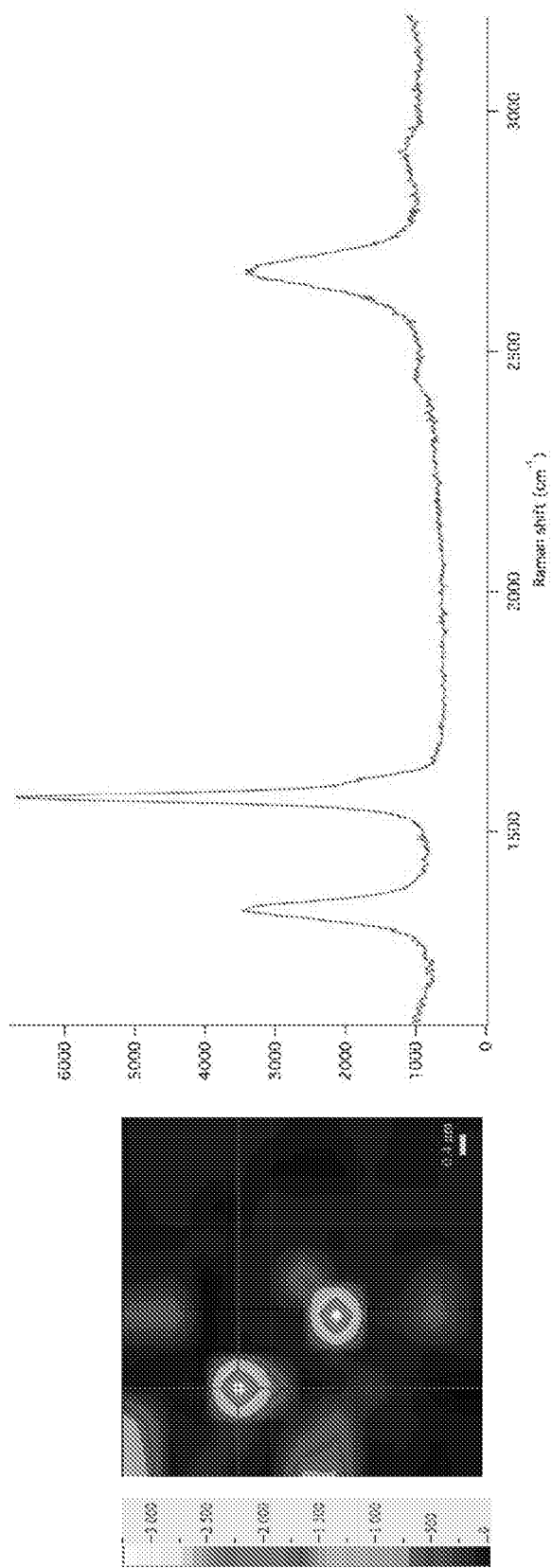

Mappings were carried out over regions of approximately 10 μm$^2$, in steps of 2 μm for the first spectrum and of 0.6 μm for the second (FIGS. 8A and 8C). On the map, the difference in color represents the differences in intensity on the G band, at 1578 cm$^{-1}$. The wavelength used is 568 nm.

In the spectra obtained, at 1335 cm$^{-1}$, an intense D band is observed, synonymous with the presence of defects in the sample. This is due to the functionalization of the material by the anthrone, which creates sp$^3$ centers and thus structural deformations. Subsequently, at 2678 cm$^{-1}$, the shape of the 2D band indicates the number of layers of the sample. In this instance, the completely Lorentzien shape of this band makes it possible to demonstrate the presence of functionalized graphene monolayer sheets (FIG. 8).

Example 10: Examples of the Preparation of Transparent Electrodes Using Graphene Exfoliated by Diels-Alder Reaction One of the major applications of graphene is the manufacture of transparent conducting electrodes using conducting inks. The graphene obtained by exfoliation of graphite using the process described here can be used directly in the manufacture of such electrodes. The graphene films can be obtained by various methods which have been tested, such as spin coating, spray coating or vacuum filtration. In view of the graphene concentrations used, the most effective method for the preparation of graphene films is vacuum filtration.

Figure 9:
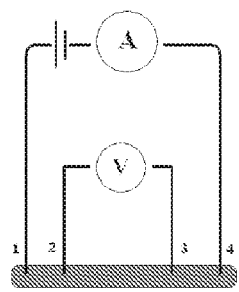
FIG. 9: Diagram of the system used in example 10 for the measurement of the conductivity of the graphene layers by the four-point probe method.

The four-point probe method was used to measure the conductivity of the graphene layers: the current is sent by a generator between points 1 and 4, while the voltage is measured between points 2 and 3. The ratio of the voltage measured to the current which passes through the sample gives the resistance of the length between the points 2 and 3 (FIG. 9).

To obtain the resistivity of this section, the infinitesimal resistances between point 1 and points 2 and 3 are integrated.

Graphene films were obtained by vacuum filtration of solutions (50 ml) of different concentrations (calculated using the Beer-Lambert law and a calibration curve) through Anodisc aluminum membranes (47 mm, size of pores of 0.02 μm). The results are presented in table 2.

TABLE 2

Conductivity of graphene layers obtained by filtration of 50 ml of graphene dispersion as described in the experimental part

| Filter | Graphite | Solvent | Concentration (mg/ml) | Resistance (Ω) | Conductance (S) |
|---|---|---|---|---|---|
| 1 | Normal | THF | 0.01 | $1.1 \times 10^5$ | $3.8 \times 10^{-5}$ |
| 3 | Nano | THF | $5.55 \times 10^{-4}$ | $2.25 \times 10^5$ | $2 \times 10^{-5}$ |
| 4 | 100 μm | THF | $2.17 \times 10^{-3}$ | $9.37 \times 10^4$ | $4.8 \times 10^{-5}$ |
| 5 | Normal | Toluene | $2.48 \times 10^{-3}$ | $1.36 \times 10^5$ | $3.3 \times 10^{-5}$ |
| 7 | Normal | Toluene + THF | $2.31 \times 10^{-3}$ | $1.05 \times 10^5$ | $4.3 \times 10^{-5}$ |

The points used are 1.6 mm apart with a radius of 40.6 μm. They are equidistant; thus, the formula=4.532 U/I (π=3.14159) is used to calculate the resistance Rs.

Example 11: Use of Alternative Techniques to Sonication: Ball-Milling

The use of sonication to accelerate the process for exfoliation by a Diels-Alder reaction can be replaced by any other technique which makes it possible to promote heterogeneous reactions. Thus, it is possible to use alternative methods to sonication, such as ball-milling or high-shear mixing (Nature Materials, 2014, 13, 624-630 [ref. 18]).

On consulting recent studies on high-shear mixing making possible the exfoliation of graphite (Nature Materials, 2014, 13, 624-630), it was demonstrated by us that this method makes it possible to considerably reduce the use of sonication.

A first experiment was carried out with an initial concentration of graphite of 2 mg/ml, i.e. 100 mg of graphite, 200 mg of anthrone and 30 mg of DIPEA in 50 ml of THF.

The high-shear mixing time is 25 minutes, using a rotor/stator system with a diameter of 22 mm, at a speed of 4500 rpm.

Subsequently, the mixture is subjected to sonication for 2 h (180 W, 37 kHz) and then purified by centrifuging (30 minutes at 3000 rpm).

The graphene concentration, determined by the Beer-Lambert law using a calibration curve (ϵ=26.2), is 0.0234 mg/ml (in comparison, C=0.02 mg/ml for sonication for 4 h without high-shear mixing).

In another experiment on a larger scale, an initial graphite concentration of 30 mg/ml, i.e. 1.0 g of graphite, 1.5 g of anthrone and 180 mg of DIPEA in 50 ml of THF, was used.

Under the same reaction conditions as above, the graphene concentration obtained is 0.0765 mg/ml.

Example 12: Stabilization of Carbon Black Suspensions

Figure 10:
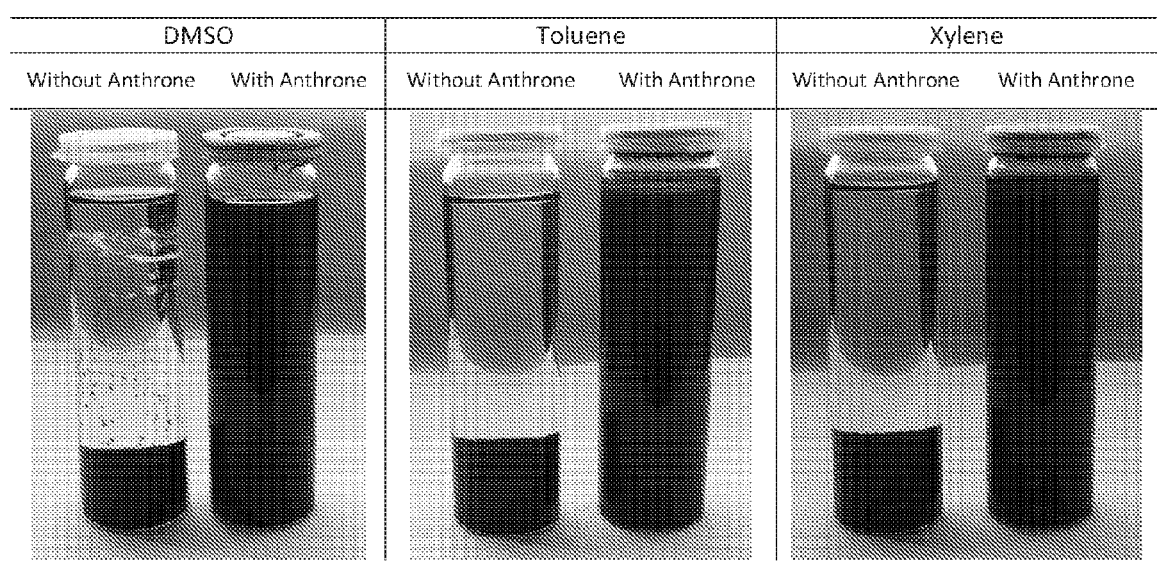
FIG. 10: Photographs of the different solutions of carbon black which are obtained in example 12 after sonication and separation by settling for 20 days (3 months for the DMSO).

The process consists in subjecting graphitic carbon black (100 mg) to ultrasound in an ultrasonic bath (4 h, 180 W, 60° C.) in the presence of anthrone (200 mg) and N,N-diisopropylethylamine (30 mg, 20 mol %) in an organic solvent (50 ml). Stable suspensions in different organic solvents are obtained (FIG. 10).

On reading the present patent application and the illustrative examples above, a person skilled in the art will observe that the present process is general and that it is applicable with all the graphites known to a person skilled in the art.

The invention claimed is:

1. A process for the exfoliation of graphite in a graphite-containing material, comprising
  subjecting the graphite-containing material to a Diels-Alder reaction with a compound of formula (I):

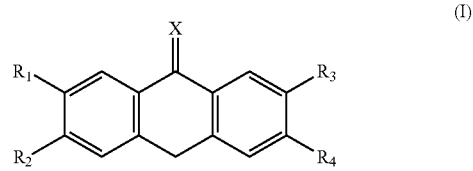

(I)

wherein:
X represents O or S;
$R_1$, $R_2$, $R_3$ and $R_4$ independently represent a hydrogen atom, —NR$^A$R$^B$, —N$^+$R$^A$R$^B$R$^C$, —OR, —CO$_2$M or —SO$_3$M; or else R$_1$ and R$_2$, on the one hand, and R$_3$ and R$_4$, on the other hand, together form an optionally substituted unsaturated C$_6$ cycloalkyl group to result in a pentacenone-type compound of formula (II) having the following structure:

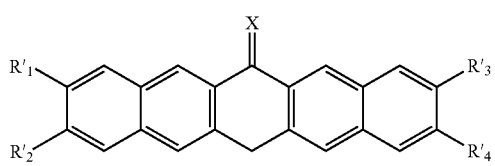
(II)

wherein:
X represents O or S;
R'$_1$, R'$_2$, R'$_3$ and R'$_4$ independently represent a hydrogen atom, —NR$^A$R$^B$, —N$^+$R$^A$R$^B$R$^C$, —OR, —CO$_2$M or —SO$_3$M;
where M represents a hydrogen atom or an alkali metal atom; and each occurrence of R, R$^A$, R$^B$ and R$^C$ independently represents a hydrogen atom or a linear or branched C$_1$ to C$_{16}$ alkyl; wherein the R radical can also represent, independently for each occurrence of R, a polyethylene glycol radical of formula:

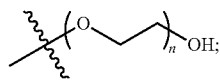

wherein n represents an integer from 1 to 6;
in an organic solvent, in the presence of a base, and under sonication, ball-milling and/or high-shear mixing, at a temperature of between 15° C. and 65° C., to obtain the corresponding graphene Diels-Alder adduct.

2. The process of claim 1, wherein the compound of formula (I) has one of the following structures:

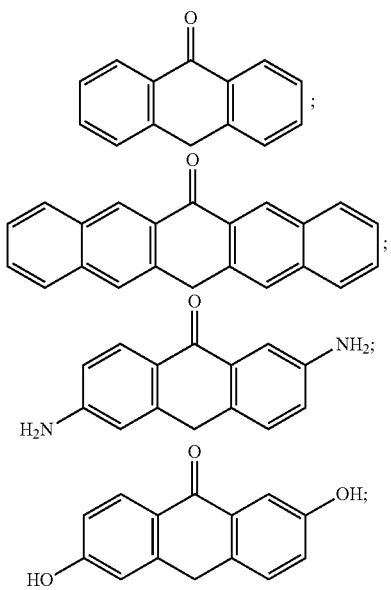

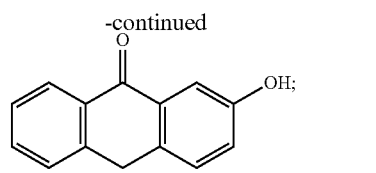

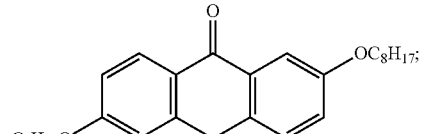

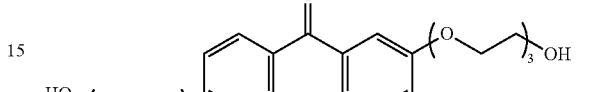

or

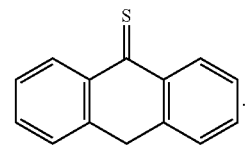

3. The process of claim 1, wherein the organic solvent is selected from the group consisting of a saturated or unsaturated aliphatic or alicyclic hydrocarbon, an aromatic hydrocarbon, an alcohol, a glycol, a halogenated hydrocarbon, a ketone, an ester, an ether, a glycol ether or another suitable organic solvent, and a mixture of two or more thereof.

4. The process of claim 1, wherein the organic solvent is selected from the group consisting of tetrahydrofuran (THF), acetonitrile, N-methyl-2-pyrrolidone (NMP), dimethylformamide (DMF), 2-propanol, toluene, benzene, chlorobenzene, and 1,2-dichlorobenzene.

5. The process of claim 1, wherein the base is di- or trialkylamine.

6. The process of claim 1, wherein the Diels-Alder reaction is carried out at a temperature of 20-65° C.

7. The process of claim 1, further comprising a centrifuging step.

8. The process of claim 7, further comprising a step of filtering the supernatant obtained from the centrifuging step, to isolate the Diels-Alder adduct of graphene sheets obtained by the process.

9. The process of claim 1, wherein the graphite-containing material is carbon black or graphite.

10. The process of claim 1, further comprising a step of annealing the Diels-Alder adduct of graphene sheets under vacuum, to obtain monolayer graphene, or multilayer graphene of 2 to 5 graphene sheets, or a mixture of these.

11. A Diels-Alder adduct of graphene sheets obtainable by a process according to claim 1.

12. The process of claim 3, wherein the organic solvent is an alcohol comprising at least 3 carbon atoms.

13. The process according to claim 1, wherein n represents an integer from 1 to 3.

14. The process according to claim 5, wherein the di- or trialkylamine is selected from the group consisting of diethylamine, dimethylamine, aza-crown ether, diisopropylamine, diisopropylethylamine, triethylamine, trimethylamine, tripropylamine, tributylamine, N-methylcyclohexylamine, N-ethylcyclohexylamine, N-methylcyclopentylamine, and N-ethylcyclopentylamine.

* * * * *